United States Patent
Xu et al.

(10) Patent No.: US 11,538,397 B2
(45) Date of Patent: Dec. 27, 2022

(54) FIRST SHIFT REGISTER, DRIVING METHOD THEREOF, GATE DRIVING CIRCUIT, AND DISPLAY DEVICE

(71) Applicants: Chongqing BOE Optoelectronics Technology Co., Ltd., Chongqing (CN); BOE Technology Group Co., Ltd., Beijing (CN)

(72) Inventors: Zhuo Xu, Beijing (CN); Yajie Bai, Beijing (CN); Shuai Chen, Beijing (CN); Xiaofeng Ma, Beijing (CN); Hyungkyu Kim, Beijing (CN)

(73) Assignees: Chongqing BOE Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/485,524

(22) Filed: Sep. 27, 2021

(65) Prior Publication Data

US 2022/0180797 A1    Jun. 9, 2022

(30) Foreign Application Priority Data

Dec. 9, 2020  (CN) .......................... 202011449221.9

(51) Int. Cl.
*G09G 3/3266* (2016.01)
*G09G 3/20* (2006.01)
(Continued)

(52) U.S. Cl.
CPC ............. *G09G 3/2092* (2013.01); *G09G 3/32* (2013.01); *G11C 19/28* (2013.01);
(Continued)

(58) Field of Classification Search
CPC ................... G09G 3/2092; G09G 3/32; G09G 2310/0286; G09G 2310/061;
(Continued)

(56) References Cited

U.S. PATENT DOCUMENTS

| 11,361,696 B2 * | 6/2022 | Feng ...................... G11C 19/28 |
| 2019/0206503 A1 * | 7/2019 | Zhang ................... G11C 19/28 |

(Continued)

FOREIGN PATENT DOCUMENTS

WO    WO-2019179521 A1 *   9/2019    ............... G09G 3/20

*Primary Examiner* — Jose R Soto Lopez
(74) *Attorney, Agent, or Firm* — Ling Wu; Stephen Yang; Ling and Yang Intellectual Property

(57) ABSTRACT

Disclosed are a first shift register, a driving method for the same, a gate driving circuit and a display device. The first shift register includes a first unit, M second units and N third units. A first signal output terminal of the first unit is connected with M second signal input terminals of the M second units. A second signal output terminal of each second unit is connected with third signal input terminals of N/M third units respectively. The first unit outputs a voltage of a first clock signal terminal to the first signal output terminal and a fourth signal output terminal under the control of a first signal input terminal and a second clock signal terminal and outputs a voltage of a first voltage terminal to the first signal output terminal and the fourth signal output terminal.

15 Claims, 12 Drawing Sheets

(51) Int. Cl.
 *G09G 3/32* (2016.01)
 *G11C 19/28* (2006.01)
(52) U.S. Cl.
 CPC .............. *G09G 2310/0286* (2013.01); *G09G 2310/061* (2013.01); *G09G 2310/08* (2013.01)
(58) Field of Classification Search
 CPC .. G09G 2310/08; G09G 3/3413; G09G 3/342; G09G 3/3674; G11C 19/28
 See application file for complete search history.

(56) References Cited

U.S. PATENT DOCUMENTS

| | | | | |
|---|---|---|---|---|
| 2020/0020266 A1* | 1/2020 | Feng | ........................ | G11C 19/28 |
| 2020/0098441 A1* | 3/2020 | Zhang | ..................... | G11C 19/28 |
| 2020/0152283 A1* | 5/2020 | Qing | ................... | G09G 3/3266 |
| 2020/0194089 A1* | 6/2020 | Xu | ........................ | G09G 3/3648 |
| 2021/0074234 A1* | 3/2021 | Wang | ................... | G09G 3/3674 |
| 2021/0327335 A1* | 10/2021 | Feng | ........................ | G11C 19/28 |
| 2021/0335193 A1* | 10/2021 | Cong | ..................... | G11C 19/28 |
| 2021/0358362 A1* | 11/2021 | Zhang | ................. | G11C 19/287 |

* cited by examiner

FIRST SHIFT REGISTER, DRIVING METHOD THEREOF, GATE DRIVING CIRCUIT, AND DISPLAY DEVICE

CROSS-REFERENCE TO RELATED APPLICATION

The present application claims the priority of Chinese patent application No. 202011449221.9, filed to the CNIPA on Dec. 9, 2020, the contents of which are hereby incorporated by reference.

TECHNICAL FIELD

Embodiments of the present disclosure relate to, but not limited to, the field of display technologies, and particularly to a first shift register, a driving method thereof, a gate driving circuit, and a display device.

BACKGROUND

With the constant development of display technologies, a Mini Light Emitting Diode (Mini LED) technology has gradually become a research hot spot in the field of display technologies. For example, a Mini LED may be used for a backlight module in a Liquid Crystal Display (LCD) device as an emitting element of the backlight module. Therefore, with the advantages of the Mini LED, the backlight module may achieve the advantages of local dimming, rapid response, simple structure, long service life and the like.

FIG. 1 is a structural schematic diagram of an exemplary Mini LED array substrate. As shown in FIG. 1, the Mini LED array substrate includes an array emitting region and a border region around the array emitting region. The border region includes an LED driver Integrated Circuit (IC) region, a fanout region and a Flexible Printed Circuit (FPC) pin region. Both the driver IC region and the fanout region are in a lower border region and occupy a relatively large size of the lower border.

SUMMARY

The below is a summary about the subject matter described in the present disclosure in detail. The summary is not intended to limit the scope of protection of the claims.

An embodiment of the present disclosure provides a first shift register, which includes a first unit, M second units and N third units. M and N are positive integers, N is an integral multiple of M, 2≤M, and 2≤N/M. The first unit is connected with a first signal input terminal, a first clock signal terminal, a second clock signal terminal, a first voltage terminal, a first reset signal terminal, a first signal output terminal and a fourth signal output terminal respectively and arranged to output a voltage of the first clock signal terminal to the first signal output terminal and the fourth signal output terminal under the control of the first signal input terminal and the second clock signal terminal and output a voltage of the first voltage terminal to the first signal output terminal and the fourth signal output terminal under the control of the first reset signal terminal and the second clock signal terminal. The second unit is connected with a second signal input terminal, a second signal output terminal and a control clock signal terminal respectively and arranged to output a voltage of the control clock signal terminal to the second signal output terminal under the control of the second signal input terminal. The third unit is connected with an output clock signal terminal, a third signal input terminal and a third signal output terminal respectively and arranged to output a voltage of the output clock signal terminal to the third signal output terminal under the control of the third signal input terminal. The first signal output terminal of the first unit in the first shift register is connected with the M second signal input terminals of the M second units. The second signal output terminal of each second unit is connected with the third signal input terminals of N/M third units respectively. Different second signal output terminals are connected with different third signal input terminals. Different second units are connected with different control clock signal terminals. Different third units are connected with different output clock signal terminals.

In an exemplary embodiment, the first unit includes an input module, an energy storage module, a first output module, a first reset module, a pull-down control module and a pull-down module. The input module is connected with the first signal input terminal, the second clock signal terminal and a pull-up node and arranged to output a signal of the first signal input terminal to the pull-up node under the control of the second clock signal terminal. The energy storage module is connected with the pull-up node and arranged to store a voltage of the pull-up node or charge the pull-up node. The first output module is connected with the pull-up node, the first clock signal terminal, the first signal output terminal and the fourth signal output terminal and arranged to output a signal of the first clock signal terminal to the first signal output terminal and the fourth signal output terminal under the control of the pull-up node. The first reset module is connected with the first reset signal terminal, the first voltage terminal and the pull-up node and arranged to output the voltage of the first voltage terminal to the pull-up node under the control of the first reset signal terminal. The pull-down control module is connected with the second clock signal terminal, the first voltage terminal, the pull-up node and a pull-down node and arranged to output a signal of the second clock signal terminal to the pull-down node under the control of the second clock signal terminal, the first voltage terminal and the pull-up node. The pull-down module is connected with the pull-down node, the first voltage terminal, the first signal output terminal and the fourth signal output terminal and arranged to output the voltage of the first voltage terminal to the first signal output terminal and the fourth signal output terminal under the control of the pull-down node.

In an exemplary embodiment, the input module includes a first transistor. A gate of the first transistor is connected with the second clock signal terminal, a first electrode of the first transistor is connected with the first signal input terminal, and a second electrode of the first transistor is connected with the pull-up node. The energy storage module includes a first capacitor. One terminal of the first capacitor is connected with the pull-up node, and the other terminal of the first capacitor is connected with the first signal output terminal. The first output module includes a second transistor and a seventh transistor. A gate of the second transistor is connected with the pull-up node, a first electrode of the second transistor is connected with the first clock signal terminal, and a second electrode of the second transistor is connected with the first signal output terminal. A gate of the seventh transistor is connected with the pull-up node, a first electrode of the seventh transistor is connected with the first clock signal terminal, and a second electrode of the seventh transistor is connected with the fourth signal output terminal. The first reset module includes a third transistor. A gate of the third transistor is connected with the first reset signal terminal, a first electrode is connected with the first voltage terminal, and a second electrode is connected with the pull-up node. The pull-down control module includes a fourth transistor and a fifth transistor. A gate and first electrode of the fourth transistor are connected with the second clock signal terminal, and a second electrode of the fourth transistor is connected with the pull-down node. A gate of the fifth transistor is connected with the pull-up node, a first electrode of the fifth transistor is connected with the first voltage terminal, and a second electrode of the fifth transistor is connected with the pull-down node. The pull-down module includes a sixth transistor and an eighth transistor. A gate of the sixth transistor is connected with the pull-down node, a first electrode of the sixth transistor is connected with the first voltage terminal, and a second electrode of the sixth transistor is connected with the first signal output terminal. A gate of the eighth transistor is connected with the pull-down node, a first electrode of the eighth transistor is connected with the first voltage terminal, and a second electrode of the eighth transistor is connected with the fourth signal output terminal.

In an exemplary embodiment, the second unit includes a ninth transistor. A gate of the ninth transistor is connected with the second signal input terminal, a first electrode of the ninth transistor is connected with the control clock signal terminal, and a second electrode of the ninth transistor is connected with the second signal output terminal. The third unit includes a tenth transistor. A gate of the tenth transistor is connected with the third signal input terminal, a first electrode is connected with the output clock signal terminal, and a second electrode is connected with the third signal output terminal.

In an exemplary embodiment, the first unit further includes a denoising signal output terminal, and is arranged to output a voltage of the second clock signal terminal to the denoising signal output terminal as a denoising voltage under the control of a signal terminal. The second unit includes an intermediate denoising module, connected with the denoising signal output terminal, the first voltage terminal and the second signal output terminal and arranged to output the voltage of the first voltage terminal to the second signal output terminal for denoising under the control of the denoising signal output terminal. The third unit includes an output denoising module, connected with the denoising signal output terminal, the first voltage terminal and the third signal output terminal and arranged to output the voltage of the first voltage terminal to the third signal output terminal for denoising under the control of the denoising signal output terminal.

In an exemplary embodiment, the denoising signal output terminal is connected with the pull-down node. The intermediate denoising module includes an eleventh transistor. A gate of the eleventh transistor is connected with the denoising signal output terminal, a first electrode of the eleventh transistor is connected with the first voltage terminal, and a second electrode of the eleventh transistor is connected with the second signal output terminal. The output denoising module includes a twelfth transistor. A gate of the twelfth transistor is connected with the denoising signal output terminal, a first electrode of the twelfth transistor is connected with the first voltage terminal, and a second electrode of the twelfth transistor is connected with the third signal output terminal.

In an exemplary embodiment, $M \leq 4$, and $N/M \leq 6$.

An embodiment of the present disclosure provides a gate driving circuit, which includes two gate driving units. One gate driving unit includes at least two stages of abovementioned first shift registers which are cascaded. The other gate driving unit includes at least two stages of cascaded second shift registers. The second shift register includes a fourth unit, M any abovementioned second units and N any abovementioned third units. The fourth unit is connected with a first signal input terminal, a first clock signal terminal, a second clock signal terminal, a first voltage terminal, a first reset signal terminal and a first signal output terminal respectively and arranged to output a voltage of the first clock signal terminal to the first signal output terminal under the control of the second clock signal terminal and output a voltage of the first voltage terminal to the first signal output terminal under the control of the first reset signal terminal and the second clock signal terminal. The first signal output terminal of the fourth unit is connected with M second signal input terminals of the M second units. Third signal output terminals in the gate driving unit are arranged to be connected with gate lines which are sequentially arranged, the gate lines being divided into different gate line groups with each including N gate lines. One of the two gate driving units is connected with the gate lines in odd gate line groups which are sequentially arranged, while the other is connected with the gate lines in even gate line groups which are sequentially arranged.

In each gate driving unit: a first signal input terminal of a first-stage shift register is connected with an initial signal terminal, a first signal input terminal of the shift register of any stage except the first-stage shift register is connected with a first signal output terminal of a previous-stage shift register of the shift register of the present stage, and a first reset signal terminal of the shift register of any stage except a last-stage shift register is connected with a first signal output terminal of a next-stage shift register of the shift register of the present stage.

An embodiment of the present disclosure also provides a display device, which includes any abovementioned gate driving circuit and further includes a backlight module and a driver IC. The backlight module includes multiple point light sources which are arranged in an array. The driver IC is arranged to provide a channel driving signal for the point light source. A fourth signal output terminal is arranged to provide a reset driving signal for the point light source.

In an exemplary embodiment, the point light source is a Mini light emitting diode or a Micro light emitting diode.

An embodiment of the present disclosure also provides a driving method for driving any abovementioned first shift register, which includes the following operations. The first unit outputs a voltage of a first clock signal terminal to a first signal output terminal and a fourth signal output terminal under the control of a first signal input terminal and a second clock signal terminal. The M second units output voltages of M control clock signal terminals to M second signal output terminals respectively under the control of the first signal output terminal. The N third units output voltages of N output clock signal terminals to N third signal output terminals respectively under the control of the M second signal output terminals. The first unit outputs a voltage of a first voltage terminal to the first signal output terminal and the fourth signal output terminal under the control of a first reset signal terminal and the second clock signal terminal. Herein, a second clock signal and a first clock signal are a group of opposite clock signals, a voltage time period corresponding to N/M output clock signal terminals of N/M third units connected with the same second unit is in a voltage time period corresponding to the clock control signal terminal of the second unit, and a voltage time period corresponding to the M control clock signal terminals of the M second units connected with the first unit is in a voltage time period corresponding to the first clock signal terminal of the first unit.

Other characteristics and advantages of the present disclosure will be elaborated in the following specification and, moreover, partially become apparent from the specification or are understood by implementing the present disclosure. The other advantages of the present disclosure may be achieved and obtained through solutions described in the specification, the claims and the drawings.

Other aspects will become apparent upon reading and understanding the drawings and the detailed description.

BRIEF DESCRIPTION OF DRAWINGS

The drawings provide an understanding to the technical solution of the present disclosure, form a part of the specification, and are adopted to explain, together with the embodiments of the present disclosure, the technical solutions of the present disclosure and not intended to form limits to the technical solutions of the present disclosure.

DETAILED DESCRIPTION

The embodiments of the present disclosure will be described below in combination with the drawings in detail. The following embodiments are adopted to describe the present disclosure but not intended to limit the scope of the present disclosure. It is to be noted that the embodiments in the present disclosure and characteristics in the embodiments may be freely combined without conflicts.

Unless otherwise defined, technical terms or scientific terms used in the embodiments of the present disclosure should have the same meanings as commonly understood by those of ordinary skill in the art that the present disclosure belongs to. "First", "second", and similar terms used in the embodiments of the present disclosure do not represent any sequence, number, or significance but are only adopted to distinguish different components. "Include", "contain", or a similar term means that an element or object appearing before the term covers an element or object and equivalent thereof listed after the term and does not exclude other elements or objects.

It can be understood by those skilled in the art that transistor adopted in all the embodiments of the present disclosure may be a thin film transistor, or a field-effect transistor, or another device with the same characteristic. Preferably, the thin-film transistor used in the embodiments of the present disclosure may be an oxide semiconductor transistor. A source and drain of the transistor used here are symmetric, so the drain and the source may be interchanged. In the embodiments of the present disclosure, for distinguishing the two electrodes, except the gate, of the transistor, one electrode is called a first electrode, the other electrode is called a second electrode, the first electrode may be the source or the drain, and the second electrode may be the drain or the source.

Figure 1:
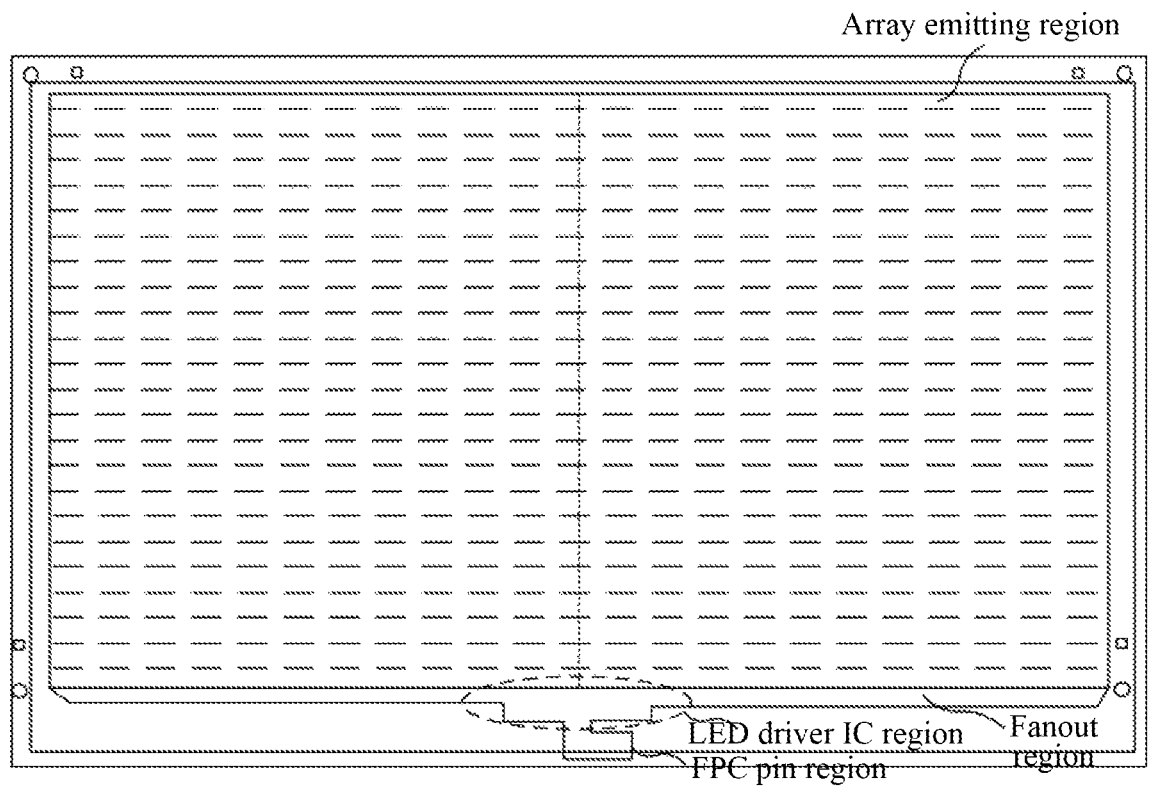
FIG. 1 is a structural schematic diagram of an exemplary Mini LED array substrate.
Figure 2:
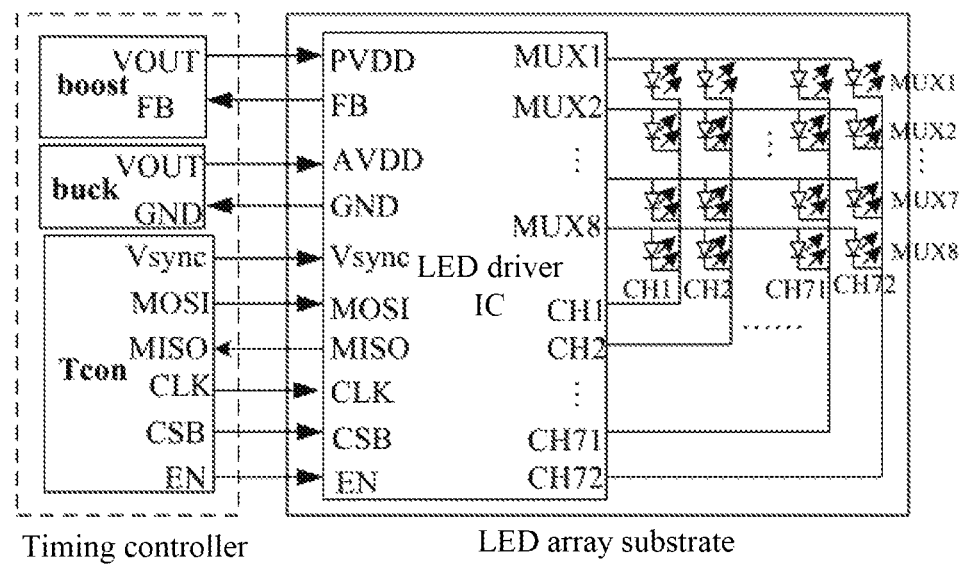
FIG. 2 is a schematic diagram of a conventional Mini-LED driving circuit.

FIG. 2 is a schematic diagram of a conventional Mini-LED driving circuit. A timing control circuit, a boost circuit, a buck circuit and the like are arranged on a timing controller (Tcon). The boost circuit and the buck circuit provide different voltage signals for an LED driver IC. The timing control circuit provides various control signals and image data signals for the LED driver IC. An LED array substrate includes 8*72=576 emitting regions. Correspondingly, the LED driver IC is required to output 8+72=80 pins, of which 8 pins are multiplexing (MUX) pins and 72 pins are channel (CH) pins. 80 fanout leads are required to be correspondingly arranged in a fanout region of the LED array substrate. Therefore, a driver IC region and the fanout region occupy a relatively large lower border size at present.

Figure 3:
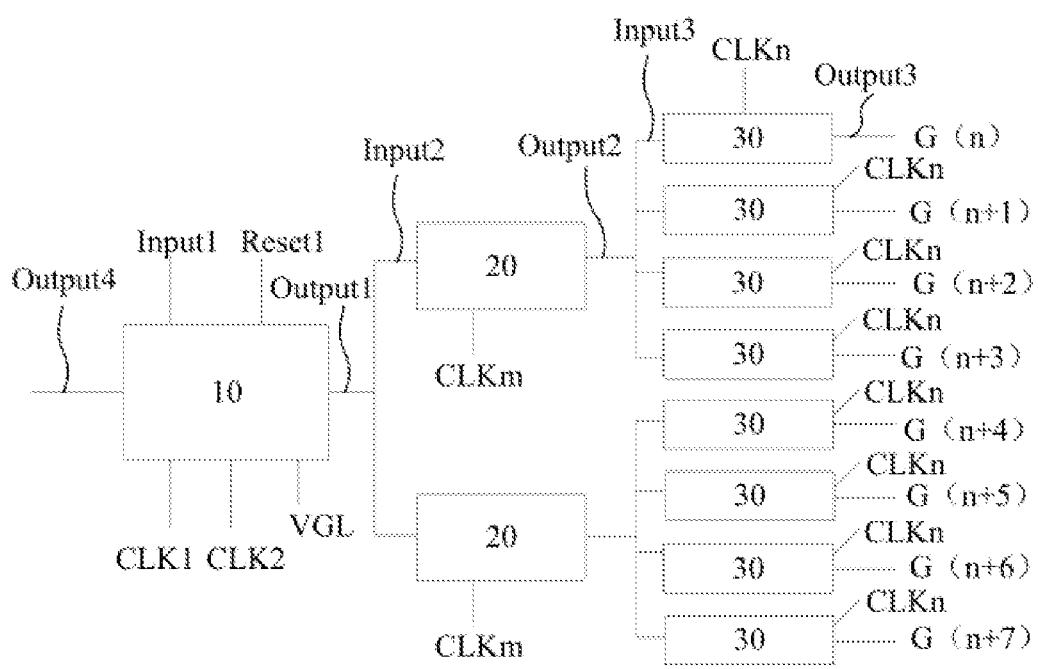
FIG. 3 is a structural schematic diagram of a first shift register according to an embodiment of the present disclosure.

An embodiment of the present disclosure provides a first shift register, which, referring to FIG. 3, includes a first unit 10, M second units 20 and N third units 30. M and N are positive integers, N is an integral multiple of M, 2≤M, and 2≤N/M;

In an exemplary embodiment, considering practical wiring and signal control of the shift register, M≤4, and N/M≤6.

Exemplarily, as shown in FIG. 3, M=2, and N=8, namely N/M=4. The embodiment of the present disclosure will further be described taking M=2 and N=8 as an example in all the following embodiments. However, no limits are made thereto in the embodiment of the present disclosure.

Figure 4:
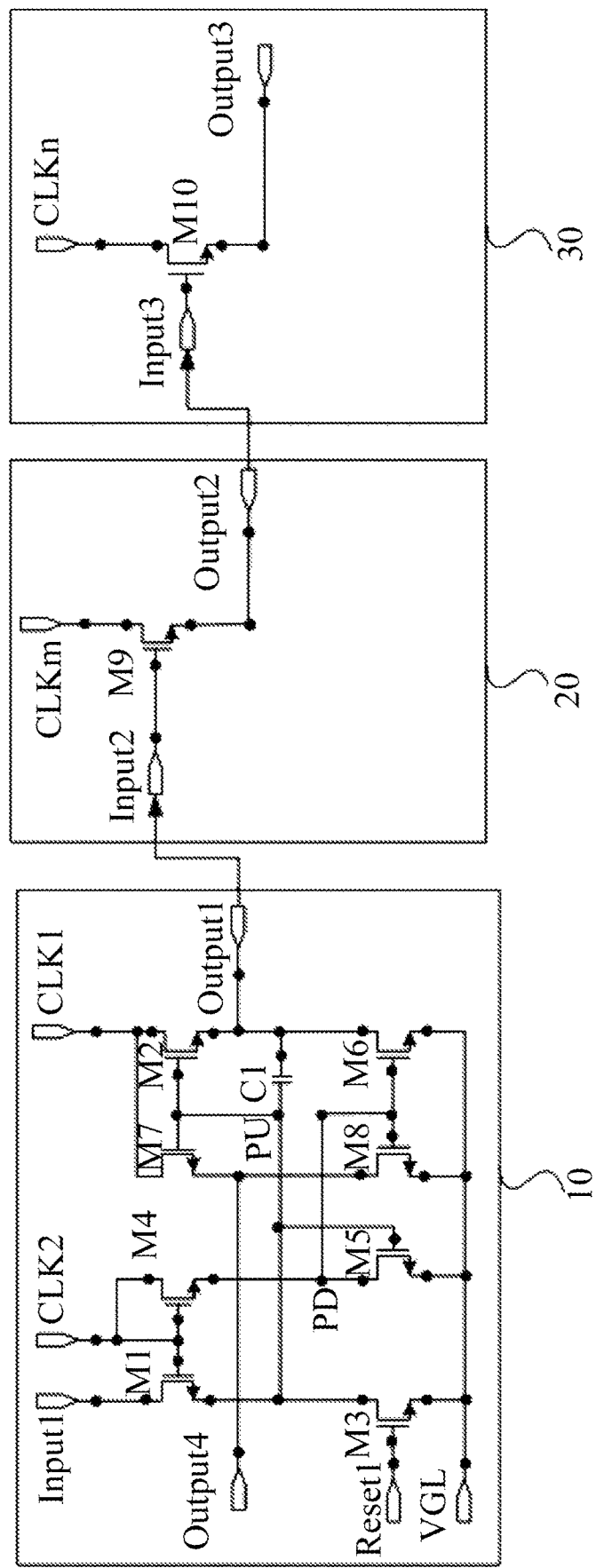
FIG. 4 is a structural schematic diagram of each unit of a first shift register according to an embodiment of the present disclosure.

As shown in FIGS. 3 and 4, the first unit 10 includes a first signal input terminal Input1, a first clock signal terminal CLK1, a second clock signal terminal CLK2, a first voltage terminal VGL, a first reset signal terminal Reset1, a first signal output terminal Output1 and a fourth signal output terminal Output4, and is arranged to output a voltage of the first clock signal terminal CLK1 to the first signal output terminal Output1 and the fourth signal output terminal Output4 as a working voltage under the control of the first signal input terminal Input1 and the second clock signal terminal CLK2 and output a voltage of the first voltage terminal VGL to the first signal output terminal Output1 and the fourth signal output terminal Output4 as a turn-off voltage under the control of the first reset signal terminal Reset1 and the second clock signal terminal CLK2.

The second unit 20 includes a second signal input terminal Input2, a second signal output terminal Output2 and a control clock signal terminal CLKm and arranged to output a voltage of the control clock signal terminal CLKm to the second signal output terminal Output2 as a working voltage under the control of the second signal input terminal Input2.

The third unit 30 includes an output clock signal terminal CLKn, a third signal input terminal Input3 and a third signal output terminal Output3 and arranged to output a voltage of the output clock signal terminal CLKn to the third signal output terminal Output3 as a working voltage under the control of the third signal input terminal Input3.

In addition, referring to FIG. 4, the first signal output terminal Output1 of the first unit 10 in the first shift register is connected with two (or M) second signal input terminals Input2 of two (or M) second units 20 (different second units are provided with different second signal input terminals).

The second signal output terminal Output2 of each second unit 20 is connected with the third signal input terminals Input3 of four (or N/M) third units 30 respectively. Different second signal output terminals Output2 are connected with different third signal input terminals Input3.

Different second units 20 are connected with different control clock signal terminals CLKm. Different third units 30 are connected with different output clock signal terminals CLKn.

FIG. 4 only shows a connection relationship between a first unit 10, a second unit 20 and a third unit 30. The other second units 20 and third units 30 may refer to the connection relationship between the corresponding units in FIG. 4.

In addition, the working voltage in the embodiment of the present disclosure refers to a voltage for effectively controlling a certain unit to work (or be turned on). The working voltage may be different when the unit is arranged into different structures. No limits are made thereto in the embodiment of the present disclosure.

The first shift register provided in the embodiment of the present disclosure may provide a multiplexing (MUX) driving signal for an LED array substrate through the fourth signal output terminal Output4, so that the number of driving pins of an LED driver IC is reduced, a wiring space needed by a fanout region on the LED array substrate is greatly reduced, a higher-resolution local dimming function may further be realized in a display region, and the display quality is improved.

In addition, the first shift register of the embodiment of the present disclosure has multiple third units independently arranged therein, and thus is connected with gate lines through third signal output terminals in the multiple third units which are independently arranged when being used for a gate driving circuit to form independent connection relationships between adjacent gate lines. Compared with a conventional art that adjacent gate lines of a gate driving circuit are connected with two adjacent cascaded shift registers, the embodiment of the present disclosure has the following advantages. On one hand, in the embodiment of the present disclosure, a first shift register is independently connected with gate lines through multiple third units which are independently arranged in parallel, so that the probability that signals cannot be transmitted well may be reduced to a great extent. On the other hand, although the first unit may also be cascaded when the first shift register of the embodiment of the present disclosure is used for the gate driving circuit, a pulse width of a first clock signal input to the first unit of the first shift register during driving is far greater than that of a clock signal connected to the shift register in the conventional art, and if a pulse width of a clock signal is greater, the probability of a signal disorder is lower, so that the probability that signals cannot be transmitted well is further reduced.

Figure 5:
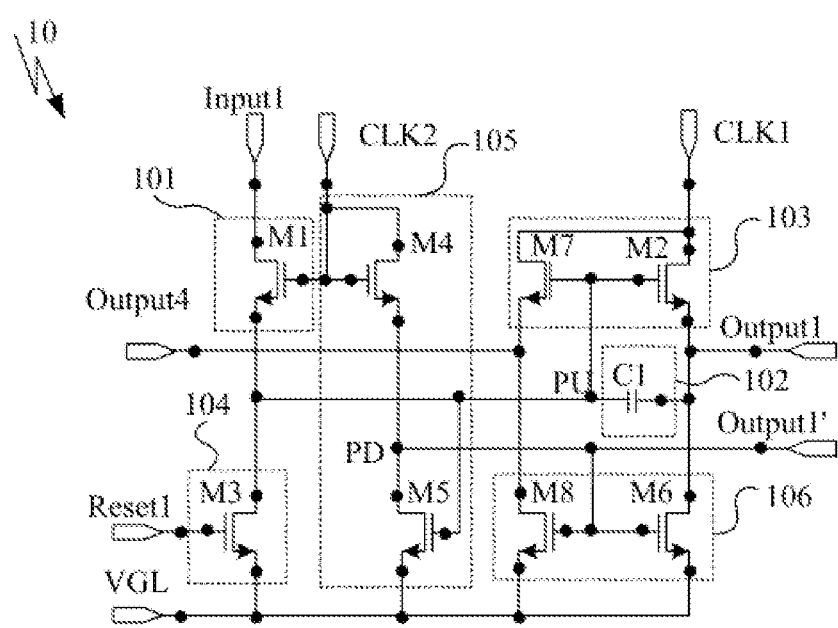
FIG. 5 is a circuit structure diagram of a first unit in a first shift register according to an embodiment of the present disclosure.

In an exemplary embodiment, FIG. 5 is a structural schematic diagram of a first unit according to an embodiment of the present disclosure. As shown in FIG. 5, the first unit provided in the embodiment of the present disclosure includes an input module 101, an energy storage module 102, a first output module 103, a first reset module 104, a pull-down control module 105 and a pull-down module 106.

The input module 101 is connected with the first signal input terminal Input1, the second clock signal terminal CLK2 and a pull-up node PU and arranged to output a signal of the first input terminal Input1 to the pull-up node PU under the control of the second clock signal terminal CLK2.

The energy storage module 102 is connected with the pull-up node PU and arranged to store a voltage of the pull-up node PU or charge the pull-up node PU.

The first output module 103 is connected with the pull-up node PU, the first clock signal terminal CLK1, the first signal output terminal Output1 and the fourth signal output terminal Output4 and arranged to output a signal of the first clock signal terminal CLK1 to the first signal output terminal Output1 and the fourth signal output terminal Output4 under the control of the pull-up node PU.

The first reset module 104 is connected with the first reset signal terminal Reset1, the first voltage terminal VGL and the pull-up node PU and arranged to output the voltage of the first voltage terminal VGL to the pull-up node PU under the control of the first reset signal terminal Reset1.

The pull-down control module 105 is connected with the second clock signal terminal CLK2, the first voltage terminal VGL, the pull-up node PU and a pull-down node PD and arranged to output a signal of the second clock signal terminal CLK2 to the pull-down node PD under the control of the second clock signal terminal CLK2, the first voltage terminal VGL and the pull-up node PU.

The pull-down module 106 is connected with the pull-down node PD, the first voltage terminal VGL, the first signal output terminal Output1 and the fourth signal output terminal Output4 and arranged to output the voltage of the first voltage terminal VGL to the first signal output terminal Output1 and the fourth signal output terminal Output4 under the control of the pull-down node PD.

In an exemplary embodiment, as shown in FIG. 5, the input module 101 provided in the embodiment of the present disclosure includes a first transistor M1.

A gate of the first transistor M1 is connected with the second clock signal terminal CLK2, a first electrode of the first transistor M1 is connected with the first signal input terminal Input1, and a second electrode of the first transistor M1 is connected with the pull-up node PU.

In an exemplary embodiment, as shown in FIG. 5, the energy storage module 102 provided in the embodiment of the present disclosure includes a first capacitor C1.

One terminal of the first capacitor C1 is connected with the pull-up node PU, and the other terminal of the first capacitor C1 is connected with the first signal output terminal Output1.

In an exemplary embodiment, as shown in FIG. 5, the first output module 103 provided in the embodiment of the present disclosure may include a second transistor M2 and a seventh transistor M7.

A gate of the second transistor M2 is connected with the pull-up node PU, a first electrode of the second transistor M2 is connected with the first clock signal terminal CLK1, and a second electrode of the second transistor M2 is connected with the first signal output terminal Output1.

A gate of the seventh transistor M7 is connected with the pull-up node PU, a first electrode of the seventh transistor M7 is connected with the first clock signal terminal CLK1, and a second electrode of the seventh transistor M7 is connected with the first signal output terminal Output1.

In an exemplary embodiment, as shown in FIG. 5, the first reset module 104 provided in the embodiment of the present disclosure may include a third transistor M3.

A gate of the third transistor M3 is connected with the first reset signal terminal Reset1, a first electrode of the third transistor M3 is connected with the first voltage terminal VGL, and a second electrode of the third transistor M3 is connected with the pull-up node PU.

In an exemplary embodiment, as shown in FIG. 5, the pull-down control module 105 provided in the embodiment of the present disclosure may include a fourth transistor M4 and a fifth transistor M5.

A gate and first electrode of the fourth transistor M4 are connected with the second clock signal terminal CLK2, and a second electrode of the fourth transistor M4 is connected with the pull-down node PD.

A gate of the fifth transistor M5 is connected with the pull-up node PU, a first electrode of the fifth transistor M5 is connected with the first voltage terminal VGL, and a second electrode of the fifth transistor M5 is connected with the pull-down node PD.

In an exemplary embodiment, as shown in FIG. 5, the pull-down module 106 provided in the embodiment of the present disclosure may include a sixth transistor M6 and an eighth transistor M8.

A gate of the sixth transistor M6 is connected with the pull-down node PD, a first electrode of the sixth transistor M6 is connected with the first voltage terminal VGL, and a second electrode of the sixth transistor M6 is connected with the first signal output terminal Output1.

A gate of the eighth transistor M8 is connected with the pull-down node PD, a first electrode of the eighth transistor M8 is connected with the first voltage terminal VGL, and a second electrode of the eighth transistor M8 is connected with the fourth signal output terminal Output4.

FIG. 5 shows an exemplary structure of the input module 101, the energy storage module 102, the first output module 103, the first reset module 104, the pull-down control module 105 and the pull-down module 106. It is easily understood by those skilled in the art that an implementation mode of the input module 101, the energy storage module 102, the first output module 103, the first reset module 104, the pull-down control module 105 and the pull-down module 106 is not limited thereto as long as respective functions may be realized.

In an exemplary embodiment, referring to FIG. 4, the second unit 20 may include a ninth transistor M9. A gate of the ninth transistor M9 is connected with the second signal input terminal Input2 (namely connected with the first signal output terminal Output1), a first electrode of the ninth transistor M9 is connected with the control clock signal terminal CLKm, and a second electrode of the ninth transistor M9 is connected with the second signal output terminal Output2.

In an exemplary embodiment, referring to FIG. 4, the third unit may include a tenth transistor M10. A gate of the tenth transistor M10 is connected the third signal input terminal Input3 (namely connected with the second signal output terminal Output2), a first electrode of the tenth transistor M10 is connected with the output clock signal terminal CLKn, and a second electrode of the tenth transistor M10 is connected with the third signal output terminal Output3. The third signal output terminal Output3 is connected with a gate line G during a practical application.

Figure 6:
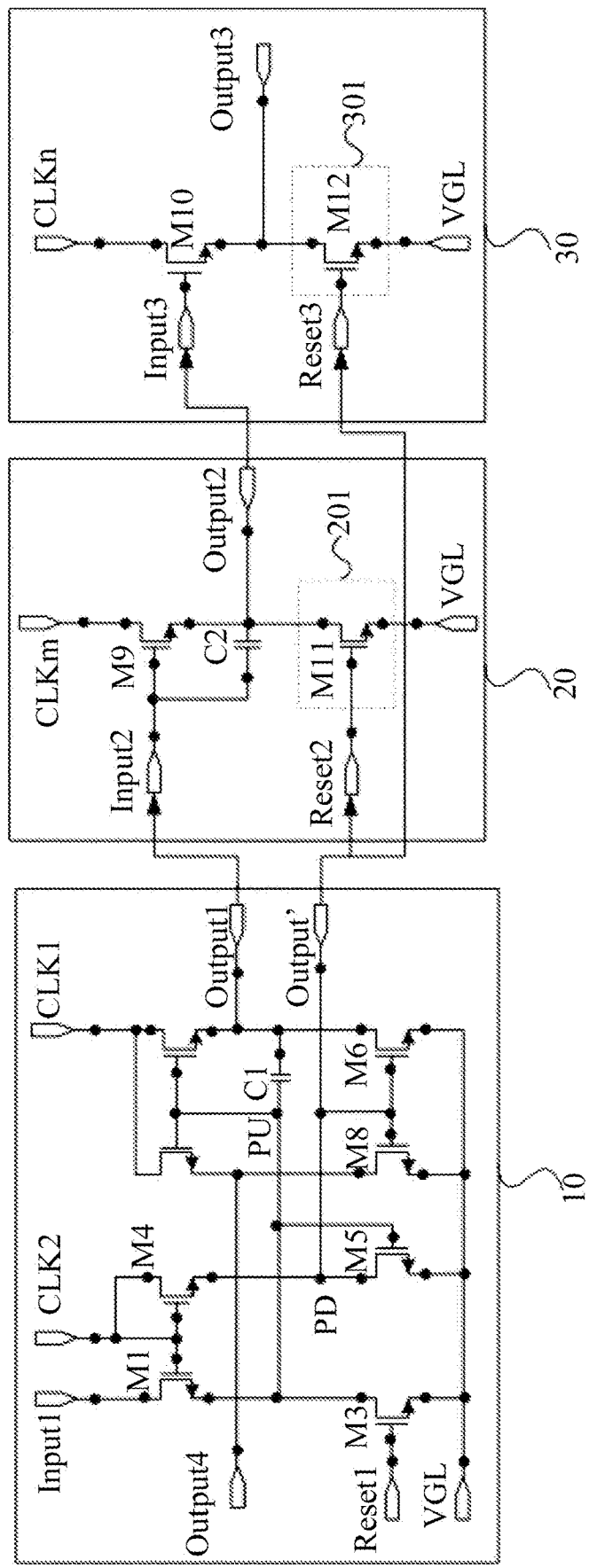
FIG. 6 is a structural schematic diagram of each unit of another first shift register according to an embodiment of the present disclosure.

Based on this, in order to reduce a noise of an output signal of the first shift register in use, referring to FIG. 6, in an exemplary embodiment, the first unit 10 further includes a denoising signal output terminal Output', and is arranged to output a voltage of the second clock signal terminal CLK2 to the denoising signal output terminal Output' as a denoising voltage under the control of a signal terminal.

The second unit 20 may further include an intermediate denoising module 201. The intermediate denoising module 201 is connected with the denoising signal output terminal Output', the first voltage terminal VGL and the second signal output terminal Output2 and arranged to output the first voltage terminal VGL to the second signal output terminal Output2 for denoising under the control of the denoising signal output terminal Output'. Of course, a memory capacitor (e.g., a second capacitor C2 in FIG. 6) may be selectively arranged in practice between the gate of the ninth transistor M9 and the second signal output terminal Output2 in the second unit 20 to reduce a noise generated by parasitic capacitance of the ninth transistor M9, thereby further reducing the noise of the output signal. Of course, normal work will not be affected if the memory capacitor is not arranged.

The third unit 30 may further include an output denoising module 301. The output denoising module 301 is connected with the denoising signal output terminal Output', the first voltage terminal VGL and the third signal output terminal Output3 and arranged to output the first voltage terminal VGL to the third signal output terminal Output3 for denoising under the control of the denoising signal output terminal Output'.

Similarly, a memory capacitor (not shown in FIG. 6) may be selectively arranged in practice between the gate of the tenth transistor M10 and the third signal output terminal Output3 in the third unit 30 to reduce a noise generated by parasitic capacitance of the tenth transistor M10, thereby further reducing the noise of the output signal. Of course, normal work will not be affected if the memory capacitor is not arranged.

In an exemplary embodiment, based on the adoption of the circuit shown in FIG. 5 for the first unit 10, the denoising signal output terminal Output' may be directly arranged to be connected with the pull-down node PD (referring to FIG. 6) such that the voltage of the second clock signal terminal CLK2 is output to the denoising signal output terminal Output' as a denoising voltage under the control of the pull-down node PD and the intermediate denoising module 201 and the output denoising module 301 are controlled by the denoising signal output terminal Output' to implement step-by-step denoising.

In an exemplary embodiment, referring to FIG. 6, the intermediate denoising module 201 may include an eleventh transistor M11. A gate of the eleventh transistor M11 is connected with the denoising signal output terminal Output', a first electrode of the eleventh transistor M11 is connected with the first voltage terminal VGL, and a second electrode of the eleventh transistor M11 is connected with the second signal output terminal Output2.

The output denoising module 301 may include a twelfth transistor M12. A gate of the twelfth transistor M12 is connected with the denoising signal output terminal Output', a first electrode of the twelfth transistor M12 is connected with the first voltage terminal VGL, and a second electrode of the twelfth transistor M12 is connected with the third signal output terminal Output3.

The intermediate denoising module 201 of the second unit and the output denoising module 301 of the third unit may also enhance the output stability by increasing the number of thin film transistors. No limits are made thereto in the embodiment of the present disclosure.

In summary, on one hand, it can be understood with reference to FIG. 6 that the voltage of the second clock signal terminal CLK2 is output to the denoising signal output terminal Output' as a denoising voltage under the control of the pull-down node PD, and a signal output by the denoising signal output terminal Output' (i.e., the signal of the second clock signal terminal CLK2) may laterally denoise the second unit and the third unit (through the first voltage terminal VGL) step by step respectively. That is, when the first shift register is used for a gate driving circuit, a noise in the gate driving circuit may be laterally attenuated step by step (references may be made to an output signal simulation diagram of FIG. 12) and may not be longitudinally transmitted. Therefore, practical stable displaying is facilitated, and the requirements of low risk and high controllability of a product are met.

On the other hand, for an equivalent circuit of the first shift register provided in the embodiment of the present disclosure, taking the circuit provided in FIG. 6 as an example, the first unit 10 is 8T1C (namely eight transistors and one capacitor), the second unit 20 is 2T0C (or 2T1C), and the third unit 30 is 2T0C (or 2T1C). It should be understood that a signal to noise ratio of an output signal (referring to the output signal simulation diagram of FIG. 12) may substantially reach the same output level as a 12T1C shift register in a conventional gate driving circuit capable of implementing step-by-step driving. However, each first shift register in the embodiment of the present disclosure adopts 28 transistors and at most 11 capacitors (which may be 1 capacitor in the first unit) to control eight gate lines, i.e., a 28T11C. That is, 3.5T1C is substantially adopted for each gate line on the average.

That is, the first shift register in the embodiment of the present disclosure satisfies the same output level as the conventional 12T1C shift register and may greatly reduce the number of used transistors, so that a manufacturing process is simplified, and the manufacturing cost is reduced. In addition, a distribution space of the gate driving circuit (the gate driving circuit is usually arranged at a border position of the product) is reduced, so that a border width of the product is reduced (namely a screen-to-body ratio of a display device is increased), and furthermore, the implementation of a narrow-border design of the product is facilitated. Moreover, the number of pins of the LED driver IC on the array substrate is further reduced, the number of fanout pins of the fanout region is reduced, and a narrower lower border and higher-resolution local dimming are implemented.

Figure 7:
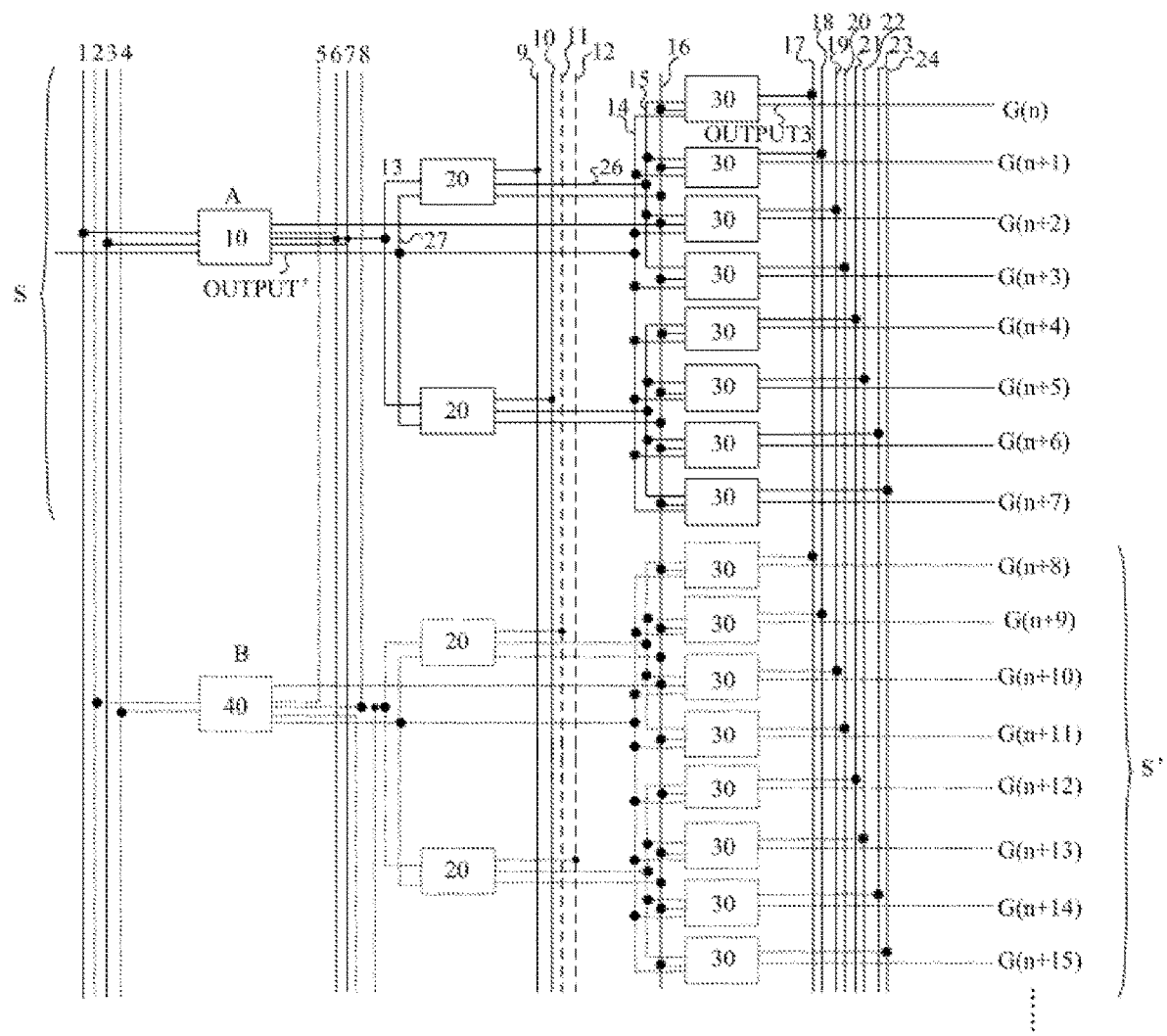
FIG. 7 is a structural schematic diagram of a gate driving circuit according to an embodiment of the present disclosure.

An embodiment of the present disclosure also provides a gate driving circuit. As shown in FIG. 7, the gate driving circuit includes two gate driving units (a gate driving unit S and a gate driving unit S'). The gate driving unit S includes at least two stages of any abovementioned first shift registers which are cascaded. The gate driving unit S' includes at least two stages of cascaded second shift registers. FIG. 7 shows only one shift register in each of the two gate driving units (the shift register in the embodiment of the present disclosure may be a first shift register or a second shift register). References can be made to the first shift register A shown by the solid line in the gate driving unit S and the second shift register B shown by the dotted line in the gate driving unit S' in FIG. 7.

Figure 8:
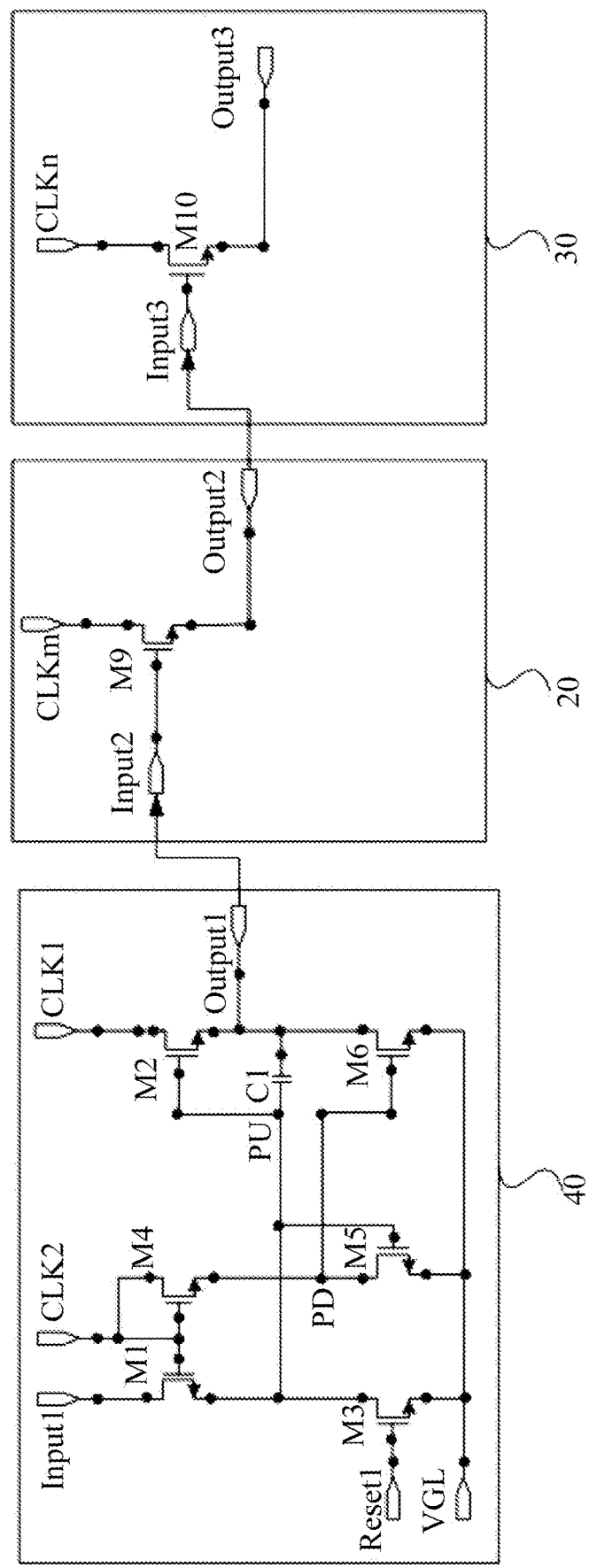
FIG. 8 is a structural schematic diagram of each unit of a second shift register according to an embodiment of the present disclosure.

As shown in FIGS. 7 and 8, the second shift register includes a fourth unit 40, M any abovementioned second units 20 and N any abovementioned third units 30. The fourth unit 40 is connected with a first signal input terminal Input1, a first clock signal terminal CLK1, a second clock signal terminal CLK2, a first voltage terminal VGL, a first reset signal terminal Reset1 and a first signal output terminal Output1 respectively and arranged to output a voltage of the first clock signal terminal CLK1 to the first signal output terminal Output1 as a working voltage under the control of the second clock signal terminal CLK2 and output a voltage of the first voltage terminal VGL to the first signal output terminal Output1 as a turn-off voltage under the control of the first reset signal terminal Reset1 and the second clock signal terminal CLK2. The first signal output terminal Output1 of the fourth unit 40 is connected with M second signal input terminals Input2 of the M second units 20. Structures of the second unit 20 and the third unit 30 are the same as those of the second unit 20 and the third unit 30 in the abovementioned embodiment of the present disclosure, and will not be elaborated herein.

Referring to FIGS. 4 and 8, compared with the abovementioned first unit 10, the fourth unit 40 includes no seventh transistor M7, eighth transistor M8 and fourth signal output terminal Output4, and the other structures are the same. Therefore, the second shift register adopting a working principle similar to that of the abovementioned first shift register in the embodiment of the present disclosure satisfies the same output level as a conventional 12T1C shift register and may greatly reduce the number of used transistors, so that a manufacturing process is simplified, and the manufacturing cost is reduced. In addition, a distribution space of the gate driving circuit (the gate driving circuit is usually arranged at a border position of a product) is reduced, so that a border width of the product is reduced (namely a screen-to-body ratio of a display device is increased), and furthermore, the implementation of a narrow-border design of the product is facilitated.

Figure 9:
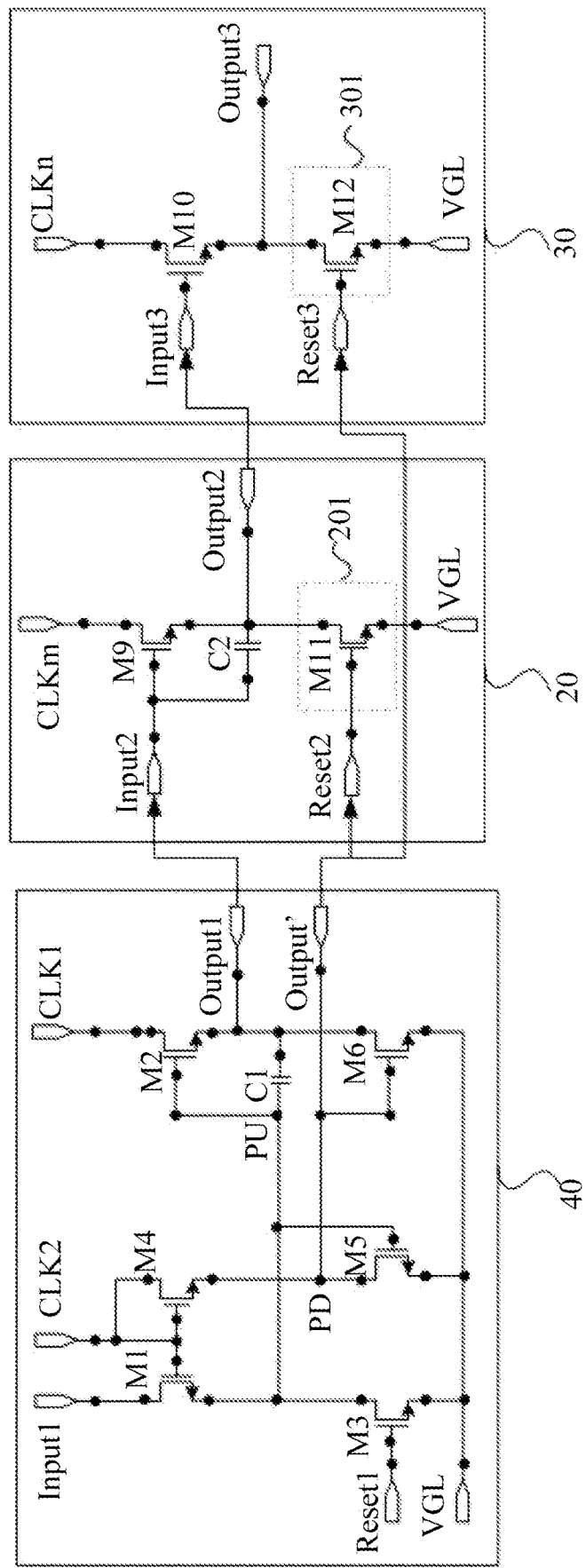
FIG. 9 is a structural schematic diagram of each unit of another second shift register according to an embodiment of the present disclosure.

Based on this, in order to reduce a noise of an output signal of the second shift register in use, referring to FIG. 9, in an exemplary embodiment, the fourth unit 40 may further include a denoising signal output terminal Output', and is arranged to output a voltage of the second clock signal terminal CLK2 to the denoising signal output terminal Output' as a denoising voltage under the control of a signal terminal.

In summary, the gate driving circuit has the same beneficial effects as the abovementioned first shift register, and elaborations are omitted herein.

It should be understood that, during a practical application, third signal output terminals Output3 in the gate driving circuit (i.e., third signal output terminals of the third units in the shift registers) are arranged to be connected with gate lines which are sequentially arranged. References can be made to gate lines G(n) to G(n+15) in FIG. 7.

The gate driving units (S and S') formed by cascading the abovementioned first shift registers and the second shift registers respectively are arranged in the gate driving circuit in the embodiment of the present disclosure. Considering practical control and the design of a driving signal, in the embodiment of the present disclosure, two different gate driving units (S and S') are arranged, the gate driving unit S is connected with the gate lines in odd gate line groups which are sequentially arranged, and the other gate driving unit S' is connected with the gate lines in even gate line groups which are sequentially arranged. For the gate line groups, the gate lines which are sequentially arranged are divided into different gate line groups with each including eight (or N) gate lines (of course, different gate line groups are formed by different gate lines). For example, in FIG. 7, the first eight solid gate lines G(n) to G(n+7) are divided into the same group and connected with the gate driving unit S, and the last eight dotted gate lines G(n+8) to G(n+15) are divided into the same group and connected with the gate driving unit S'. It should be understood that a next gate line group of the gate line group G(n+8) to G(n+15) is solid and connected with the gate driving unit S, and a next gate line group of the next gate line group is dotted and connected with the gate driving unit S'.

It should also be understood here that the gate lines in the even gate line groups which are sequentially arranged should be sequentially connected in one-to-one correspondence with the shift registers in the corresponding gate driving unit according to a cascading order (namely the even gate line groups which are sequentially arranged are connected in one-to-one correspondence with the shift registers which are sequentially cascaded). For example, if gate lines in a first even gate line group are connected with third signal output terminals of an ith-stage shift register in the gate driving unit, gate lines in a second even gate line group should be connected with third signal output terminals of an (i+2)th-stage shift register in the gate driving unit. The gate lines in the odd gate line groups are connected in a similar manner, and elaborations are omitted herein.

The shift registers in the two gate driving units are alternately sequenced in FIG. 7 according to a sequential alternate sequencing relationship of the even gate line groups and the odd gate line groups. It should be understood here that FIG. 7 only illustrate connection relationships clearly and should not be considered as a limit to the embodiment of the present disclosure. During practical manufacturing, relative arrangement positions of each shift register may be changed according to a practical wiring requirement as long as connection relationships thereof are kept the same as those in FIG. 7.

In addition, a cascading situation of the shift registers in each gate driving unit will further be described.

A first signal input terminal Input1 of a first-stage shift register is connected with an initial signal terminal STV. Of course, since there are two gate driving units in the embodiment of the present disclosure, two initial signal terminals, e.g., STV(A) and STV(B) in FIG. 10, should be arranged, which are connected with the first signal input terminals Input1 of the first-stage shift registers in the two gate driving units respectively.

A first signal input terminal Input1 of the shift register of any stage except the first-stage shift register is connected with a first signal output terminal Output1 of a previous-stage shift register of the shift register of the present stage. That is, an output signal of a first signal output terminal Output1 of the shift register of the present stage is taken as an input signal of a first signal input terminal Input1 of a next-stage shift register.

A first reset signal terminal Reset1 of the shift register of any stage except a last-stage shift register is connected with a first signal output terminal Output1 of a next-stage shift register of the shift register of the present stage. That is, an output signal of a first signal output terminal Output1 of the shift register of the present stage is taken as an input signal of a first reset signal terminal Reset1 of a previous-stage shift register.

Of course, it should be understood here that the initial signal terminal STV is usually independently arranged for the first signal input terminal Input1 of the first-stage shift register. However, the embodiment of the present disclosure is not limited thereto. Alternatively, a first signal output terminal Output1 of the last-stage shift register may be connected with the first signal input terminal Input1 of the first-stage shift register, namely an output signal of the first signal output terminal Output1 of the last-stage shift register is taken as an initial signal of the first signal input terminal Input1 of the first-stage shift register.

Similarly, for a first reset signal terminal Reset1 of the last-stage shift register, the first reset signal terminal Reset1 may be independently arranged, or the first signal output terminal Output1 of the first-stage shift register may be connected with the first reset signal terminal Reset1 of the last-stage shift register. No limits are made thereto in the embodiment of the present disclosure.

In addition, different signal lines are usually required to be arranged for the two gate driving units. The first shift register A in the gate driving unit S and the second shift register B in the gate driving unit S' FIG. 7 are taken as an example.

Figure 10:
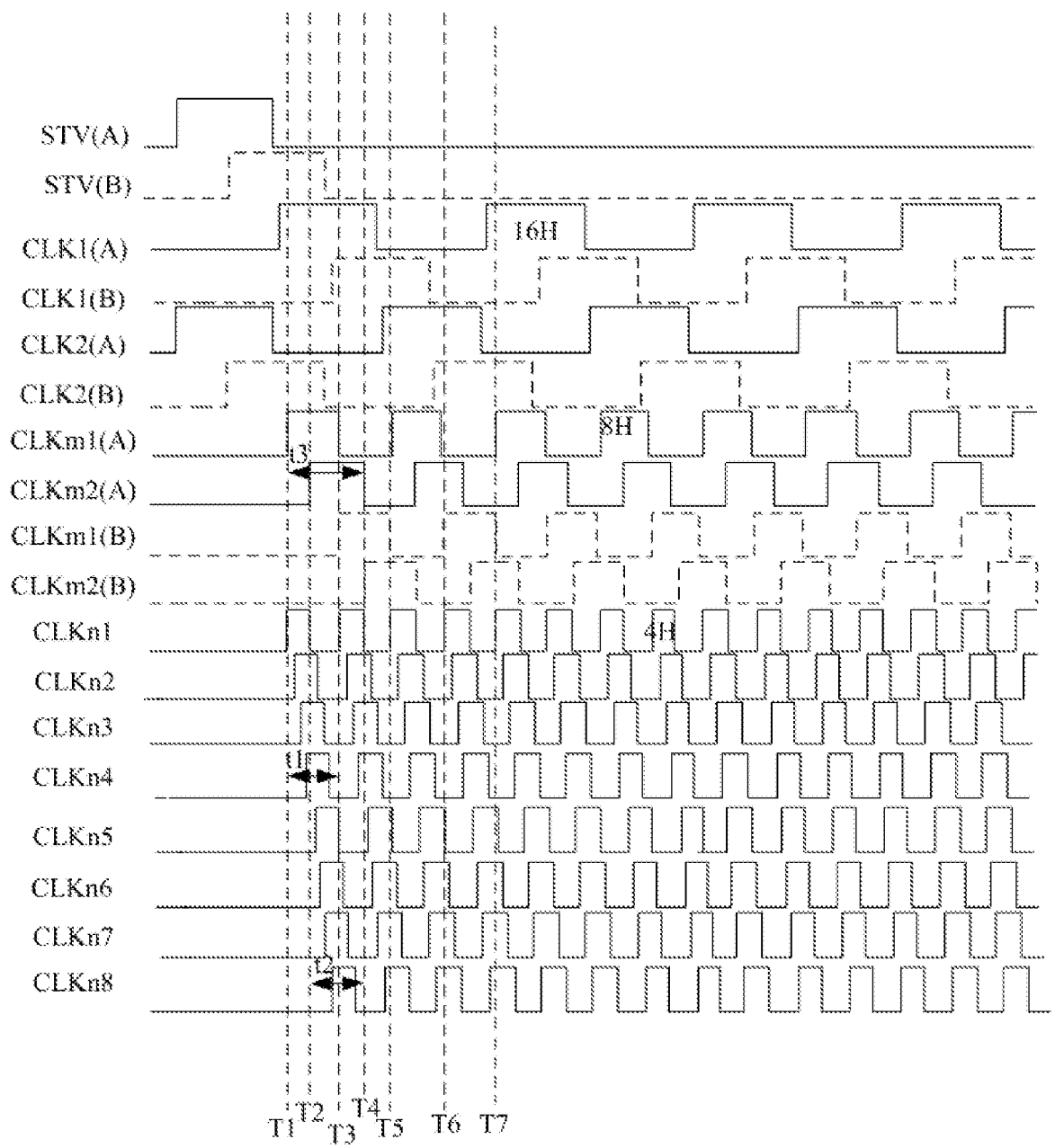
FIG. 10 is a signal timing diagram of a gate driving circuit according to an embodiment of the present disclosure.

For example, a first clock signal connection signal line 1 (corresponding to signal CLK1(A) in FIG. 10) and a second clock signal connection signal line 3 (corresponding to signal CLK2(A) in FIG. 10) are arranged in the gate driving unit S (the first unit 10) in FIG. 7, and a first clock signal connection signal line 2 (corresponding to signal CLK1(B) in FIG. 10) and a second clock signal connection signal line 4 (corresponding to signal CLK2(B) in FIG. 10) are arranged in the gate driving unit S' (the fourth unit 40).

Similarly, the control clock signal terminals CLKm in different gate driving units (the second units 20) are connected with different signal lines, e.g., signal lines 9, 10, 11 and 12 in FIG. 7. In an exemplary implementation mode, two control clock signal terminals in the first shift register A in the gate driving unit S are connected with a signal line 9 and a signal line 10 respectively, and two control clock signal terminals in the second shift register B in the gate driving unit S' are connected with a signal line 11 and a signal line 12 respectively.

For the same gate driving unit, the control clock signal terminals of different units in the same shift register are connected with different signal lines, and the control clock signal terminals of the second units in the shift registers of different stages may be correspondingly shared. For example, in FIG. 7, two control clock signal terminals corresponding to two second units in a first-stage first shift register A are connected with a signal line 9 and a signal line 10 respectively, and two control clock signal terminals of second units in a next-stage first shift register (not shown in the figure) in the gate driving unit S are also correspondingly connected with the signal line 9 and the signal line 10 respectively.

However, for signal lines connected with the output clock signal terminals in the two gate driving units, different signal lines may be arranged for the output clock signal terminals of different gate driving units, like the abovementioned signal lines connected with the control clock signal terminals. The difference is that the output clock signal terminals in the two gate driving units may select shared signal lines for connection according to a practical signal design. Of course, a design solution based on shared signal lines is optionally adopted.

In an exemplary implementation mode, references can schematically be made to FIG. 7 when the output clock signal terminals in the two gate driving units share the signal lines. Eight output clock signal terminals (CLKn1, CLKn2, CLKn3, CLKn4, CLKn5, CLKn6, CLKn7 and CLKn8) in the first shift register A in the gate driving unit S are connected with eight different signal lines (signal lines 17 to 24) respectively, and eight output clock signal terminals in the second shift register B in the gate driving unit S' may also be connected with the eight signal lines (signal lines 17 to 24) respectively. Of course, a timing relationship of clock signals loaded on the eight signal lines (signal lines 17 to 24) should be ensured to ensure the normal driving of the circuit.

Based on this, the other signal lines in FIG. 7 will be briefly described taking the first shift register A in the gate driving unit S and the second shift register B in the gate driving unit S' in FIG. 7 as an example.

A signal line 5 is a signal line connected with the first input terminal Input1 of the fourth unit 40 in the second shift register B. Of course, the signal line is also connected with a first signal output terminal Output1 of a fourth unit 40 in a previous-stage second shift register of the second shift register B in the gate driving unit S'.

A signal line 6 is a signal line connected with the first input terminal Input1 of the first unit 10 in the first shift register A. Of course, the signal line is also connected with a first signal output terminal Output1 of a first unit 10 in a previous-stage first shift register of the first shift register A in the gate driving unit S.

A signal line 7 is a signal line connected with the first signal output terminal Output1 of the first unit 10 in the first shift register A. Of course, the signal line is also connected with a first reset signal terminal Reset1 of a first unit 10 in a previous-stage first shift register of the first shift register A and a first signal input terminal Input1 of a first unit 10 in a next-stage first shift register in the gate driving unit S. Moreover, the signal line is also connected with the second signal input terminal Input2 of the second unit 20 in the first shift register A (through a line 13 in FIG. 5).

A signal line 8 is a signal line connected with the first signal output terminal Output1 of the fourth unit 40 in the second shift register B. Of course, the signal line is also connected with a first reset signal terminal Reset1 of a fourth unit 40 in a previous-stage second shift register of the second shift register B and a first signal input terminal Input1 of a fourth unit 40 in a next-stage second shift register in the gate driving unit S'. Moreover, the signal line is also connected with the second signal input terminal Input2 of the second unit 20 in the second shift register B.

The denoising signal output terminals Output' in the first unit 10 of the first shift register and the fourth unit 40 of the second shift register denoise the second unit 20 and the third unit 30 through a signal line 27 and a signal line 14 respectively.

A signal line 16 is a signal line providing a voltage for the first voltage terminal VGL in each unit.

A signal line 26 is a signal line connecting the second signal output terminal Output2 of the second unit 20 with the third signal input terminal Input3 of the corresponding third unit 30.

The other signal lines will not be elaborated herein one by one, and may specifically refer to related connection lines in FIGS. 4 to 6.

An embodiment of the present disclosure also provides a display device, which includes the abovementioned gate driving circuit and further includes a backlight module and a driver IC. The backlight module includes multiple point light sources which are arranged in an array. The driver IC is arranged to provide channel driving signals for the multiple point light sources. Fourth signal output terminals are arranged to provide reset driving signals for the multiple point light sources.

The display device provided in the embodiment of the present disclosure also has the same structure and beneficial effects as the first shift register provided in the abovementioned embodiment. Since the structure and beneficial effects of the first shift register have been described in detail in the abovementioned embodiment, elaborations are omitted herein.

In an exemplary embodiment, the point light source may be a Mini light emitting diode or a Micro light emitting diode.

The display device of the embodiment of the present disclosure may be any product or component with a display function, such as a mobile phone, a tablet computer, a television, a display, a notebook computer, a digital photo frame, and a navigator.

Figure 11A:
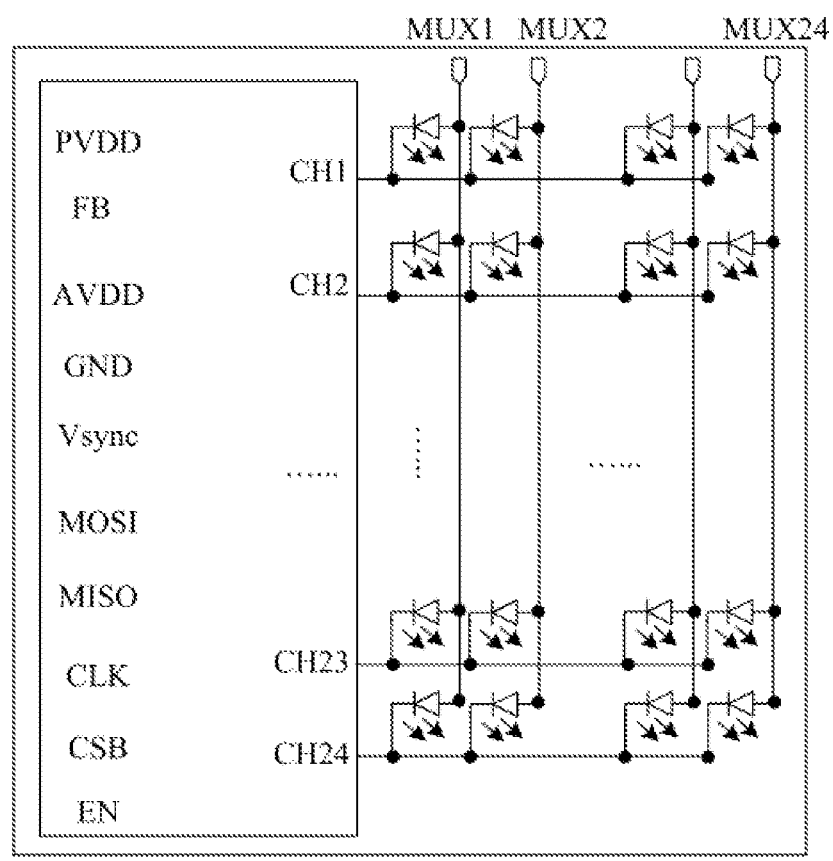
FIGS. 11A and 11B are structural schematic diagrams of two LED array substrates according to an embodiment of the present disclosure.
Figure 11B:
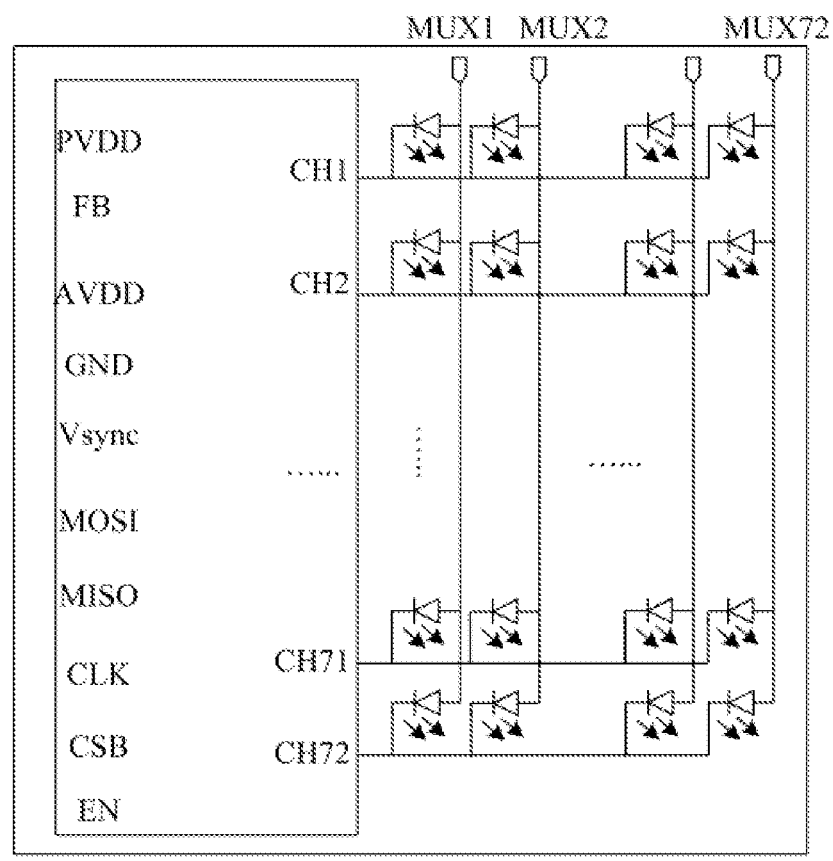

FIGS. 11a and 11b are schematic array driving diagrams of two LED array substrates according to an embodiment of the present disclosure. The LED array substrate in FIG. 11a includes 24*24=576 emitting regions, only 24 pins are required to be output in a corresponding LED driver IC region. 24 fanout leads are required to be correspondingly arranged in a fanout region of the LED array substrate. Compared with a conventional array driving mode, the LED array substrate has the advantages that a wiring space needed by the fanout region is greatly reduced, and a driving circuit of the LED driver IC region is simplified. The LED array substrate in FIG. 11b includes 72*72=5,184 emitting regions, so that a higher-resolution local dimming function may be realized, and the image quality may be improved. Moreover, only 72 pins are required to be output in an LED driver IC region correspondingly, and 72 fanout leads are required to be correspondingly arranged in a fanout region of the LED array substrate. Therefore, a wiring space is reduced, and a driving circuit is simplified.

In the embodiment of the present disclosure, when N=8, the number of shift registers is ⅛ of the number of output gate lines, and the shift registers of every two stages lead out a stage of multiplexing driving signal (Output4). Therefore, the number of output multiplexing driving signals is 1/16 of the number of pixel rows of a display screen, namely only 67 rows of MUX driving signals may be output under resolution 1,080.

A minimum Y-directional resolution of the screen is 24*16=384 when 24 MUX driving signals are needed, and is 72*16=1,152 when 72 MUX driving signals are needed. With the improvement of the resolution of the display screen, more MUX signals may be provided. Elaborations are omitted herein.

The number of MUX driving signals and a cascaded circuit diagram are correspondingly adjusted when the cascading of 4CLK (namely N=4), 6CLK (namely N=6), 10CLK (namely N=10) and 12CLK (namely N=12) is adopted for gate line outputs. Elaborations are omitted in the embodiment of the present disclosure.

The below provides a driving method for the abovementioned first shift register. References are made to FIG. 10. FIGS. 6 and 7 are combined. A solid timing signal in FIG. 10 corresponds to the first shift register A in FIG. 7, and a dotted timing signal corresponds to the second shift register B in FIG. 7.

The driving method includes the following operations.

A first input signal is input to a first signal input terminal Input1 of a first unit 10. A second clock signal is input to a second clock signal terminal CLK2. A first clock signal is input to a first clock signal terminal CLK1. The first clock signal is output to a first signal output terminal Output1 and a fourth signal output terminal Output4 as a working voltage under the control of the first signal input terminal Input1 and the second clock signal terminal CLK2.

Different control clock signals are input to two (or M) control clock signal terminals (CLKm1 and CLKm2) of two (or M) second units respectively. The different control clock signals are output to two (or M) second signal output terminals Output2 as working voltages respectively under the control of the working voltage output by the first signal output terminal Output1.

Eight (or N) different output clock signals are input to output clock signal terminals (CLKn1 to CLKn8) of eight (or N) third units 30 respectively. The eight (or N) different output clock signals are output to eight (or N) third signal output terminals Output3 as working voltages respectively under the control of working voltages output by the second signal output terminals Output2.

A working voltage time period corresponding to four (or N/M) output clock signals input to four (or N/M) third units 30 connected with the same second unit 20 (i.e., an output time period when the four output clock signals are output as working voltages) is in a working voltage time period corresponding to a control clock signal input to the second unit (i.e., an output time period when the control clock signal is output as a working voltage).

In an exemplary implementation mode, references can be made to FIG. 10. Taking timing signals (solid) corresponding to the first shift register A as an example, a working voltage time period t1 corresponding to CLKn1 to CLKn4 input to four third units 30 connected with one second unit 20 is in a working voltage time period T1 to T3 corresponding to a control clock signal CLKm1(A) input to the second unit 20. The working voltage time period is an output time period when the control clock signal terminal CLKm1(A) output as a working voltage in the second unit 20. Similarly, a working voltage time period t2 corresponding to CLKn5 to CLKn8 input to four third units 30 connected with the other second unit 20 is in a working voltage time period T2 to T4 corresponding to a control clock signal CLKm2(A) input to the second unit 20. The working voltage time period is an output time period when the control clock signal terminal CLKm2(A) is output as a working voltage in the second unit 20.

In addition, a working voltage time period corresponding to two (or M) control clock signals input to two (or M) second units 20 connected with the first unit 10 (i.e., output time when the two output clock signals are output as working voltages) is in a working voltage time period corresponding to a first clock signal input to the first unit 10 (i.e., an output time period when the first clock signal is output as a working voltage).

In an exemplary implementation mode, references can be made to FIG. 10. Taking timing signals (solid) corresponding to the first shift register A as an example, a working voltage time period t3 corresponding to two control clock signals CLKm1(A) and CLKm2(A) input to two second units 20 respectively is in a working voltage time period T1 to T5 corresponding to a first clock signal CLK1(A) input to the first unit 10.

Of course, the driving method further includes the following operations.

A first reset signal is input to a first reset signal terminal Reset1 of the first unit 10. A second clock signal is input to the second clock signal terminal CLK2. A voltage of a first voltage terminal VGL is output to the first signal output terminal Output1 and the fourth signal output terminal Output4 as a turn-off voltage under the control of the first reset signal. The second clock signal and the first clock signal are a group of opposite clock signals. For example, references are made to CLK1(A) and CLK2(A) in FIG. 10.

That is, CLK2(A) is a low level when CLK1(A) is a high level, and CLK2(A) is a high level when CLK1(A) is a low level.

In addition, as described above, a design mode in FIG. 6 is optionally adopted for the first shift register in practice, to reduce a noise of an output signal of the shift register in use. That is, the first unit 10 further includes a denoising signal output terminal Output', the second unit 20 includes an intermediate denoising module 201, and the third unit 30 includes an output denoising module 301. The second unit and the third unit are laterally denoised step by step through the denoising signal output terminal Output'.

In such case, a first reset signal is input to the first reset signal terminal Reset1 of the first unit 10. A second clock signal is input to the second clock signal terminal CLK2. A voltage of the first voltage terminal VGL is output to the first signal output terminal Output1 and the fourth signal output terminal Output4 as a turn-off voltage under the control of the first reset signal. Moreover, the second clock signal may further be controlled to be output to the intermediate denoising module 201 of the second unit 20 and the output denoising module 301 of the third unit 30 through the denoising signal output terminal Output' to denoise the second signal output terminal Output2 and the third signal output terminal Output3.

The whole driving process will further be described below taking the circuit of the first shift register in FIG. 6 (corresponding to the first shift register A in FIG. 7) in combination with the turning-off/off of transistors (in combination with the timing signals in FIG. 10).

Turning-on/off processes of the transistors in FIG. 6 are described below with an example that all the transistors are N-type transistors. However, the embodiment of the present disclosure is not limited thereto. All the transistors in FIG. 6 may optionally be P-type transistors. Of course, in such case, it is necessary to flip each control signal in FIG. 10 and connect a module or transistor connected with the first voltage terminal VGL to a second voltage terminal VGH. Descriptions are made in the following embodiment with an example that each transistor is an N-type transistor, namely all the abovementioned working voltages are high-level voltages.

A First Stage (Referring to FIG. 6)

A first input signal input by a first signal input terminal Input1 is a high level (for a first-stage shift register, an input initial signal STV is a high level, referring to STV(A) in FIG. 10). A second clock signal input by a second clock signal terminal CLK2 is a high level (referring to CLK2(A) in FIG. 10). A first transistor M1 is turned on, and a first capacitor C1 is charged with the high level. A fourth transistor M4 is turned on, and the high level of the second clock signal is output to a pull-down node PD. A sixth transistor M6 and an eighth transistor M8 are turned on under the control of a high potential of the pull-down node PD to reset a first signal output terminal Output1 and a fourth signal output terminal Output4 through a first voltage terminal VGL (i.e., a turn-off voltage). Moreover, a signal of the second clock signal terminal CLK2 may turn on an eleventh transistor M11 and a twelfth transistor M12 through a denoising signal output terminal Output' to denoise a second signal output terminal Output2 and a third signal output terminal Output3 step by step.

A Second Stage

A plate connected with a pull-up node PU in the first capacitor C1 is at a high potential under a memory capacitor in the previous stage (or it may be considered that the first capacitor C1 discharges the pull-up node PU to make the pull-up node PU at the high potential). Meanwhile, the first clock signal terminal CLK1 rises from a low potential to a high potential. A gate potential of a second transistor M2 is further pulled up by gate/source capacitance coupling of the second transistor M2 (namely the potential of PU is further pulled up). The second transistor M2 is turned on, and the high potential of the first clock signal terminal CLK1 (referring to time period T1 to T5 in CLK1(A) in FIG. 10) is output to the first signal output terminal Output1. Similarly, a seventh transistor M7 is turned on, and the high potential of the first clock signal terminal CLK1 (referring to time period T1 to T5 in CLK1(A) in FIG. 10) is output to the fourth signal output terminal Output4.

A ninth transistor M9 is turned on under the control of the first signal output terminal Output1, and a signal of a control clock signal terminal CLKm (referring to two control clock signal terminals CLKm1(A) and CLKm2(A) in the same shift register in FIG. 10) is output to the second signal output terminal Output2. It should be understood that, in such case, there is always a first clock signal of which a pulse width is greater than those of two control clock signals, and a whole pulse width range t3 of CLKm1(A) and CLKm2(A) is in a pulse width (T1 to T5) of CLK1(A).

Moreover, a tenth transistor M10 in the third unit is turned on under the control of signals output by two second signal output terminals Output2 (i.e., signals of CLKm1(A) and CLKm2(A)), and a signal of an output clock signal terminal CLKn (referring to eight output clock signal terminals CLKn1 to CLKn4 and CLKn5 to CLKn8 in the same shift register in FIG. 10) is output to a third signal output terminal Output3. It should be understood that, in such case, there is always a control clock signal of which a pulse width is greater than that of the output clock signal, a whole pulse width range t1 of CLKn1 to CLKn4 is in a pulse width (T1 to T3) of CLKm1(A), and a whole pulse width range t2 of CLKn5 to CLKn8 is in a pulse width (T2 to T4) in CLKm2(A).

Moreover, in this stage, a fifth transistor M5 is turned on under the control of the high potential of the pull-up node PU, so that the pull-down node PD may be kept at a low potential through the low level of the first voltage terminal VGL.

A Third Stage

A first reset signal terminal Reset1 inputs a high level, a third transistor M3 is turned on, the low level of the first voltage terminal VGL pulls down the high potential of the pull-up node PU, and a fifth transistor M5 is turned off. In this stage, the second clock signal terminal CLK2 outputs a high potential (referring to time period T5 to T7 in CLK2(A) in FIG. 10), the fourth transistor M4 is turned on, and the high level of the second clock signal is output to the pull-down node PD. The sixth transistor M6 and the eighth transistor M8 are turned on under the control of a high potential of the pull-down node PD to reset the first signal output terminal Output1 and the fourth signal output terminal Output4 through the first voltage terminal VGL (i.e., a turn-off voltage). Moreover, a signal of the second clock signal terminal CLK2 may turn on the eleventh transistor M11 and the twelfth transistor M12 through the denoising signal output terminal Output' to denoise the second signal output terminal Output2 and the third signal output terminal Output3 step by step.

Based on this, the below provides optional pulse width values and corresponding duty cycles of the abovementioned clock signals. Herein, H is a write pulse width of pixel voltages.

In an exemplary implementation mode, pulse widths of the first clock signal and the second clock signal are 16H, while duty cycles are 50%. For the gate driving circuit, a relative delay of each of the first clock signal and the second clock signal in the two gate driving units is 8H (i.e., a half of the pulse width thereof). Referring to FIG. 10, CLK1(B) is delayed by a half of a pulse width thereof relative to CLK1(A), and CLK2(B) is delayed by a half of a pulse width thereof relative to CLK2(A).

A pulse width of the control clock signal is 8H (i.e., a half of the pulse widths of the first clock signal and the second clock signal), while a duty cycle is 50%. A relative delay of each of the two control clock signals CLKm1 and CLKm2 in the same shift register is 4H (i.e., a half of the pulse width thereof). Referring to FIG. 10, CLKm2(A) is delayed by a half of the pulse width thereof relative to CLKm1(A), and CLKm2(B) is delayed by a half of the pulse width thereof relative to CLKm1(B). For shift registers connected with adjacent gate line groups in the two gate driving units, CLKm1(B) of the shift register corresponding to the present gate line group is delayed by a half of a pulse width thereof relative to CLKm2(A) of the shift register corresponding to the previous gate line group.

A pulse width of the output clock signal is 4H (i.e., a half of the pulse width of the control clock signal), while a duty cycle is less than or equal to 50%. Eight output clock signals of eight third units connected with eight sequentially adjacent gate lines are sequentially delayed by 1H. In an exemplary implementation mode, CLKn1 to CLKn8 are sequentially delayed by 1H, referring to FIG. 10.

It is set that eight output clock signals of eight third units connected with eight sequentially adjacent gate lines are sequentially delayed by 1H, H being a minimum write pulse width of pixel voltages, for a purpose of writing pixel data to sub-pixels in corresponding turned-on rows row by row through data lines without changing a data line arrangement manner for a conventional display panel when gate lines are driven by the gate driving circuit.

Optionally, H may be set to be greater than the minimum write pulse width of pixel voltages. However, normal write of pixel data cannot be ensured in a conventional data line design manner if H is set to be less than the minimum write pulse width of pixel voltages. In such case, if the gate driving circuit in the embodiment of the present disclosure is required to drive gate lines, multiple data lines are required to be arranged for a column of sub-pixels, and of course, each of the abovementioned signals is required to be adaptively adjusted. No limits are made thereto in the embodiment of the present disclosure. Elaborations are omitted herein.

In addition, it should be understood by those skilled in the art that, when the gate driving circuit in the embodiment of the present disclosure is used for displaying in practice, gate lines are driven to drive thin-film transistors T in sub-pixels in an effective display region of a display panel, and high levels are adopted as working voltages, namely the thin film transistor T is an N-type transistor. In such case, the transistor has a turn-on voltage V(H) and a turn-off voltage V(L) (the turn-off voltage is a low-level voltage of the abovementioned first voltage terminal VGL under a normal condition). Based on this, for the abovementioned clock signal, the below provides an optional clock signal design solution to implement the high/low-level control of the circuit, and further explains and describes related signal control in combination with an output signal simulation diagram (FIG. 12) of each unit in the optional clock signal design solution.

Optionally, the high level of the output clock signal (corresponding to CLKn) is the turn-on voltage V(H) of the thin-film transistor T in the effective display region, while the low level (LVGL) is less than the turn-off voltage V(L) of the thin-film transistor in the effective display region. Therefore, falling time of the thin-film transistor T from the turn-on voltage V(H) to the turn-off voltage V(L) may be reduced when the thin-film transistor T is turned off through the signal output by the third signal output terminal Output3.

Figure 12:
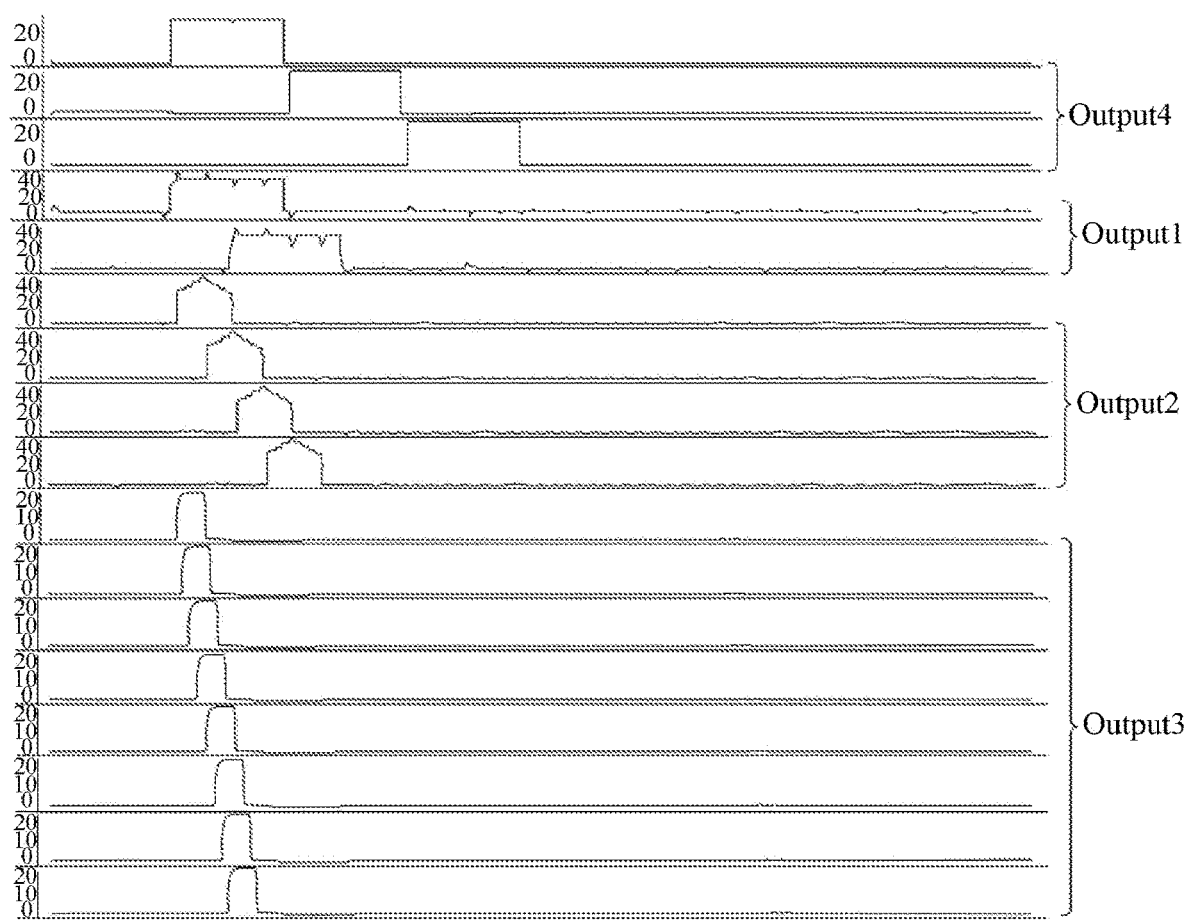
FIG. 12 is an output signal simulation diagram of a shift register according to an embodiment of the present disclosure.

In an exemplary implementation mode, referring to FIG. 12, in a time period when a second signal output terminal Output2 outputs a working voltage, e.g., time period T1 to T3, tenth transistors M10 in four third units controlled by the second signal output tend Output2 are all turned on, and third signal output terminals Output3 of the four third units sequentially output signals of CLKn1 to CLKn4 in time period T1 to T3 (referring to FIG. 12). Referring to FIG. 12, since high levels in the signals of CLKn1 to CLKn4 are the turn-on voltage V(H) of the thin-film transistor T in the effective display region, while low levels VGL (e.g., −12 v) are less than the turn-off voltage V(L) (e.g., −8 v) of the thin-film transistor in the effective display region, practical effective gate falling time, i.e., time of falling from V(H) to V(L), corresponding to the gate line (Gate) connected with the third signal output terminal Output3 is reduced (namely falling time is reduced). In addition, referring to FIG. 12, taking moment T3 as an example, a second signal output terminal Output2 in a second unit stops outputting a working voltage. In such case, a tenth transistor M10 in a third unit connected with the second unit is turned off, and a potential of a third signal output terminal Output3 of the third unit gradually returns to the voltage (−8 v) of the first voltage terminal VGL under the control of the denoising output terminal Output'. Therefore, a normal low potential level (−8 v) of the display region in a holding stage is ensured, and a leakage current is reduced.

Referring to FIG. 12, affected by the coupling of the output signals of the third signal output terminals Output3 in the third units (corresponding to sequentially input signals of CLKn1 to CLKn4), the signals output by the second signal output terminals Output2 of the second units are no more standard square waves but wholly stepped peak pulses generated by sequential rising edge coupling and falling edge coupling according to the sequential input of CLKn1 to CLKn4. Such a waveform is pulled up to a relatively high voltage level by coupling, so it may be ensured that the tenth transistor M10 in the third unit has a relatively high turn-on current, and the influence on the output (i.e., Gate Output) of the third signal output terminal Output3, particularly the influence on the falling time, is slight.

Optionally, the high level of the control clock signal (corresponding to CLKm) of the second unit 20 is greater than the turn-on voltage V(H) of the thin-film transistor in the effective display region. Therefore, the turn-on current of the tenth transistor M10 in the third unit may be increased.

In the embodiment of the present disclosure, it is optionally set that the high level of the control clock signal of the second unit 20 is greater than the turn-on voltage V(H) of the thin-film transistor in the effective display region. However, it should be understood by those skilled in the art that rising time of the output (i.e., Gate Output) of the third signal output terminal Output3 may be different because the turn-on current of the tenth transistor M10 in the third unit is different when the high level of the control clock signal of the second unit 20 is set to be relatively low, but the pulse width of the output clock signal is optionally designed to 4H in the embodiment of the present disclosure, the first 3H being pre-charging time. Therefore, the influence of the difference of the rising time of Gate Output on the practical charging of pixels may be eliminated.

Optionally, the high levels in the first clock signal (corresponding to CLK1) and second clock signal (corresponding to CLK2) in the first unit 10 are less than the turn-on voltage V(H) of the thin-film transistor in the effective display region. In such case, referring to FIG. 6, bias voltages of the sixth transistor M6 in the first unit 10, the eleventh transistor M11 in the second unit 20 and the twelfth transistor M12 in the third unit 30 may be reduced (the bias voltage is higher if the voltage is higher). Therefore, the service life of the transistor is prolonged, and the influence on the turn-on current of the tenth transistor M10 in the third unit may be eliminated.

In addition, based on the abovementioned optional clock signal design solution, referring to an output analog signal of each unit corresponding to FIG. 12, the signal (including an initial stage and a holding stage, namely before and after a pulse is output) output by the first signal output terminal Output1 has a relatively loud noise, and the circuit and signal design in the embodiment of the present disclosure are used to denoise the second unit and the third unit step by step through the first unit. As shown in FIG. 12, it can be seen that the noise of the signal (including an initial stage and a holding stage, namely before and after a pulse is output) output by the second signal output terminal Output2 is obviously reduced and the signal (including an initial stage and a holding stage, namely before and after a pulse is output) output by the third signal output terminal Output3 is substantially noiseless. That is, the signal to noise ratio of the signal output by the gate driving circuit (averagely 3.5T1C for the first shift register, averagely 3.25T1C for the second shift register, totally averagely 3.375T1C) in the embodiment of the present disclosure may substantially reach the same level as a conventional 12T1C gate driving circuit. The number of used transistors is reduced, and the manufacturing cost is reduced. In addition, a narrow-border design of the product is ensured. Moreover, the number of pins of the LED driver IC on the array substrate is reduced, the number of fanout leads in the fanout region is reduced, and a narrower lower border and higher-resolution local dimming are implemented.

The above is only the implementation mode of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the present disclosure shall be subject to the scope of protection of the claims.

The following points need to be noted.

The drawings of the embodiments of the present disclosure only involve the structures involved in the embodiments of the present disclosure, and the other structures may refer to conventional designs.

The embodiments in the present disclosure, i.e., the features in the embodiments, can be combined without conflicts to obtain new embodiments.

Although the implementation modes of the present disclosure are disclosed above, the contents are only implementation modes adopted to easily understand the present disclosure and not intended to limit the present disclosure. Those skilled in the art may make any modifications or variations to implementation forms and details without departing from the spirit and scope disclosed by the present disclosure. However, the patent protection scope of the present disclosure should also be subject to the scope defined by the appended claims.

What is claimed is:

1. A first shift register, comprising:
a first unit, M second units and N third units, wherein M and N are positive integers, N is an integral multiple of M, $2 \leq M$, and $2 \leq N/M$;
wherein the first unit is connected with a first signal input terminal, a first clock signal terminal, a second clock signal terminal, a first voltage terminal, a first reset signal terminal, a first signal output terminal and a fourth signal output terminal respectively and arranged to output a voltage of the first clock signal terminal to the first signal output terminal and the fourth signal output terminal under control of the first signal input terminal and the second clock signal terminal and output a voltage of the first voltage terminal to the first signal output terminal and the fourth signal output terminal under control of the first reset signal terminal and the second clock signal terminal;
a second unit is connected with a second signal input terminal, a second signal output terminal and a control clock signal terminal respectively and arranged to output a voltage of the control clock signal terminal to the second signal output terminal under control of the second signal input terminal;
a third unit is connected with an output clock signal terminal, a third signal input terminal and a third signal output terminal respectively and arranged to output a voltage of the output clock signal terminal to the third signal output terminal under control of the third signal input terminal; and
the first signal output terminal of the first unit in the first shift register is connected with the M second signal input terminals of the M second units; the second signal output terminal of each second unit is connected with the third signal input terminals of N/M third units respectively, and different second signal output terminals are connected with different third signal input terminals; and different second units are connected with different control clock signal terminals, and different third units are connected with different output clock signal terminals;
wherein the first unit comprises an input module, an energy storage module, a first output module, a first reset module, a pull-down control module and a pull-down module;
the input module is connected with the first signal input terminal, the second clock signal terminal and a pull-up node and arranged to output a signal of the first signal input terminal to the pull-up node under control of the second clock signal terminal;
the energy storage module is connected with the pull-up node and arranged to store a voltage of the pull-up node or charge the pull-up node;
the first output module is connected with the pull-up node, the first clock signal terminal, the first signal output terminal and the fourth signal output terminal and arranged to output a signal of the first clock signal terminal to the first signal output terminal and the fourth signal output terminal under control of the pull-up node;
the first reset module is connected with the first reset signal terminal, the first voltage terminal and the pull-up node and arranged to output the voltage of the first voltage terminal to the pull-up node under control of the first reset signal terminal;
the pull-down control module is connected with the second clock signal terminal, the first voltage terminal, the pull-up node and a pull-down node and arranged to output a signal of the second clock signal terminal to the pull-down node under control of the second clock signal terminal, the first voltage terminal and the pull-up node; and
the pull-down module is connected with the pull-down node, the first voltage terminal, the first signal output terminal and the fourth signal output terminal and arranged to output the voltage of the first voltage terminal to the first signal output terminal and the fourth signal output terminal under control of the pull-down node.

2. The first shift register according to claim 1, wherein
the input module comprises a first transistor; a gate of the first transistor is connected with the second clock signal terminal, a first electrode of the first transistor is connected with the first signal input terminal, and a second electrode of the first transistor is connected with the pull-up node;
the energy storage module comprises a first capacitor; one terminal of the first capacitor is connected with the pull-up node, and the other terminal of the first capacitor is connected with the first signal output terminal;
the first output module comprises a second transistor and a seventh transistor; a gate of the second transistor is connected with the pull-up node, a first electrode of the second transistor is connected with the first clock signal terminal, and a second electrode of the second transistor is connected with the first signal output terminal; a gate of the seventh transistor is connected with the pull-up node, a first electrode of the seventh transistor is connected with the first clock signal terminal, and a second electrode of the seventh transistor is connected with the fourth signal output terminal;
the first reset module comprises a third transistor; a gate of the third transistor is connected with the first reset signal terminal, a first electrode of the third transistor is connected with the first voltage terminal, and a second electrode of the third transistor is connected with the pull-up node;
the pull-down control module comprises a fourth transistor and a fifth transistor; a gate and first electrode of the fourth transistor are connected with the second clock signal terminal, and a second electrode of the fourth transistor is connected with the pull-down node; a gate of the fifth transistor is connected with the pull-up node, a first electrode of the fifth transistor is connected with the first voltage terminal, and a second electrode of the fifth transistor is connected with the pull-down node;
the pull-down module comprises a sixth transistor and an eighth transistor; a gate of the sixth transistor is connected with the pull-down node, a first electrode of the sixth transistor is connected with the first voltage terminal, and a second electrode of the sixth transistor is connected with the first signal output terminal; and a gate of the eighth transistor is connected with the pull-down node, a first electrode of the eighth transistor is connected with the first voltage terminal, and a second electrode of the eighth transistor is connected with the fourth signal output terminal.

3. The first shift register according to claim 1, wherein
the second unit comprises a ninth transistor; a gate of the ninth transistor is connected with the second signal input terminal, a first electrode of the ninth transistor is connected with the control clock signal terminal, and a second electrode of the ninth transistor is connected with the second signal output terminal;

the third unit comprises a tenth transistor; and a gate of the tenth transistor is connected with the third signal input terminal, a first electrode of the tenth transistor is connected with the output clock signal terminal, and a second electrode of the tenth transistor is connected with the third signal output terminal.

4. The first shift register according to claim 1, wherein the first unit further comprises a denoising signal output terminal, and is arranged to output a voltage of the second clock signal terminal to the denoising signal output terminal as a denoising voltage under control of a signal terminal;

the second unit comprises an intermediate denoising module, connected with the denoising signal output terminal, the first voltage terminal and the second signal output terminal and arranged to output the voltage of the first voltage terminal to the second signal output terminal for denoising under control of the denoising signal output terminal; and the third unit comprises an output denoising module, connected with the denoising signal output terminal, the first voltage terminal and the third signal output terminal and arranged to output the voltage of the first voltage terminal to the third signal output terminal for denoising under control of the denoising signal output terminal.

5. The first shift register according to claim 4, wherein the denoising signal output terminal is connected with the pull-down node;

the intermediate denoising module comprises an eleventh transistor; a gate of the eleventh transistor is connected with the denoising signal output terminal, a first electrode of the eleventh transistor is connected with the first voltage terminal, and a second electrode of the eleventh transistor is connected with the second signal output terminal;

the output denoising module comprises a twelfth transistor; and a gate of the twelfth transistor is connected with the denoising signal output terminal, a first electrode of the twelfth transistor is connected with the first voltage terminal, and a second electrode of the twelfth transistor is connected with the third signal output terminal.

6. The first shift register according to claim 1, wherein M≤4, and N/M≤6.

7. A gate driving circuit, comprising two gate driving units, wherein one gate driving unit of the two gate driving units comprises at least two stages of cascaded first shift registers, and the first shift register comprises a first unit, M second units and N third units, wherein M and N are positive integers, N is an integral multiple of M, 2≤M, and 2≤N/M;

the first unit is connected with a first signal input terminal, a first clock signal terminal, a second clock signal terminal, a first voltage terminal, a first reset signal terminal, a first signal output terminal and a fourth signal output terminal respectively and arranged to output a voltage of the first clock signal terminal to the first signal output terminal and the fourth signal output terminal under control of the first signal input terminal and the second clock signal terminal and output a voltage of the first voltage terminal to the first signal output terminal and the fourth signal output terminal under control of the first reset signal terminal and the second clock signal terminal;

a second unit is connected with a second signal input terminal, a second signal output terminal and a control clock signal terminal respectively and arranged to output a voltage of the control clock signal terminal to the second signal output terminal under control of the second signal input terminal;

a third unit is connected with an output clock signal terminal, a third signal input terminal and a third signal output terminal respectively and arranged to output a voltage of the output clock signal terminal to the third signal output terminal under control of the third signal input terminal;

the first signal output terminal of the first unit in the first shift register is connected with the M second signal input terminals of the M second units; the second signal output terminal of each second unit is connected with third signal input terminals of N/M third units respectively, and different second signal output terminals are connected with different third signal input terminals; different second units are connected with different control clock signal terminals, and different third units are connected with different output clock signal terminals;

the other gate driving unit of the two gate driving units comprises at least two stages of cascaded second shift registers, and the second shift register comprises a fourth unit, M second units and N third units, wherein the fourth unit is connected with a first signal input terminal, a first clock signal terminal, a second clock signal terminal, a first voltage terminal, a first reset signal terminal and a first signal output terminal respectively and arranged to output a voltage of the first clock signal terminal to the first signal output terminal under control of the second clock signal terminal and output a voltage of the first voltage terminal to the first signal output terminal under control of the first reset signal terminal and the second clock signal terminal; the first signal output terminal of the fourth unit is connected with M second signal input terminals of the M second units;

third signal output terminals in the gate driving unit are arranged to be connected with gate lines which are sequentially arranged, the gate lines being divided into different gate line groups with each comprising N gate lines; one gate driving unit of the two gate driving units is connected with the gate lines in odd gate line groups which are sequentially arranged, while the other gate driving unit of the two gate driving units is connected with the gate lines in even gate line groups which are sequentially arranged; and in each gate driving unit:

a first signal input terminal of a first-stage shift register is connected with an initial signal terminal, a first signal input terminal of the shift register of any stage except the first-stage shift register is connected with a first signal output terminal of a previous-stage shift register of the shift register of a present stage, and a first reset signal terminal of the shift register of any stage except a last-stage shift register is connected with a first signal output terminal of a next-stage shift register of the shift register of the present stage;

wherein the first unit comprises an input module, an energy storage module, a first output module, a first reset module, a pull-down control module and a pull-down module;

the input module is connected with the first signal input terminal, the second clock signal terminal and a pull-up node and arranged to output a signal of the first signal input terminal to the pull-up node under control of the second clock signal terminal;

the energy storage module is connected with the pull-up node and arranged to store a voltage of the pull-up node or charge the pull-up node;

the first output module is connected with the pull-up node, the first clock signal terminal, the first signal output terminal and the fourth signal output terminal and arranged to output a signal of the first clock signal terminal to the first signal output terminal and the fourth signal output terminal under control of the pull-up node;

the first reset module is connected with the first reset signal terminal, the first voltage terminal and the pull-up node and arranged to output the voltage of the first voltage terminal to the pull-up node under control of the first reset signal terminal;

the pull-down control module is connected with the second clock signal terminal, the first voltage terminal, the pull-up node and a pull-down node and arranged to output a signal of the second clock signal terminal to the pull-down node under control of the second clock signal terminal, the first voltage terminal and the pull-up node; and the pull-down module is connected with the pull-down node, the first voltage terminal, the first signal output terminal and the fourth signal output terminal and arranged to output the voltage of the first voltage terminal to the first signal output terminal and the fourth signal output terminal under control of the pull-down node.

8. The gate driving circuit according to claim 7, wherein the input module comprises a first transistor; a gate of the first transistor is connected with the second clock signal terminal, a first electrode of the first transistor is connected with the first signal input terminal, and a second electrode of the first transistor is connected with the pull-up node;

the energy storage module comprises a first capacitor; one terminal of the first capacitor is connected with the pull-up node, and the other terminal of the first capacitor is connected with the first signal output terminal;

the first output module comprises a second transistor and a seventh transistor; a gate of the second transistor is connected with the pull-up node, a first electrode of the second transistor is connected with the first clock signal terminal, and a second electrode of the second transistor is connected with the first signal output terminal; a gate of the seventh transistor is connected with the pull-up node, a first electrode of the seventh transistor is connected with the first clock signal terminal, and a second electrode of the seventh transistor is connected with the fourth signal output terminal;

the first reset module comprises a third transistor; a gate of the third transistor is connected with the first reset signal terminal, a first electrode of the third transistor is connected with the first voltage terminal, and a second electrode of the third transistor is connected with the pull-up node;

the pull-down control module comprises a fourth transistor and a fifth transistor; a gate and first electrode of the fourth transistor are connected with the second clock signal terminal, and a second electrode of the fourth transistor is connected with the pull-down node; a gate of the fifth transistor is connected with the pull-up node, a first electrode of the fifth transistor is connected with the first voltage terminal, and a second electrode of the fifth transistor is connected with the pull-down node;

the pull-down module comprises a sixth transistor and an eighth transistor; a gate of the sixth transistor is connected with the pull-down node, a first electrode of the sixth transistor is connected with the first voltage terminal, and a second electrode of the sixth transistor is connected with the first signal output terminal; and a gate of the eighth transistor is connected with the pull-down node, a first electrode of the eighth transistor is connected with the first voltage terminal, and a second electrode of the eighth transistor is connected with the fourth signal output terminal.

9. The gate driving circuit according to claim 7, wherein the second unit comprises a ninth transistor; a gate of the ninth transistor is connected with the second signal input terminal, a first electrode of the ninth transistor is connected with the control clock signal terminal, and a second electrode of the ninth transistor is connected with the second signal output terminal;

the third unit comprises a tenth transistor; and a gate of the tenth transistor is connected with the third signal input terminal, a first electrode of the tenth transistor is connected with the output clock signal terminal, and a second electrode of the tenth transistor is connected with the third signal output terminal.

10. The gate driving circuit according to claim 7, wherein the first unit further comprises a denoising signal output terminal, and is arranged to output a voltage of the second clock signal terminal to the denoising signal output terminal as a denoising voltage under control of a signal terminal;

the second unit comprises an intermediate denoising module, connected with the denoising signal output terminal, the first voltage terminal and the second signal output terminal and arranged to output the voltage of the first voltage terminal to the second signal output terminal for denoising under control of the denoising signal output terminal; and the third unit comprises an output denoising module, connected with the denoising signal output terminal, the first voltage terminal and the third signal output terminal and arranged to output the voltage of the first voltage terminal to the third signal output terminal for denoising under control of the denoising signal output terminal.

11. The gate driving circuit according to claim 10, wherein the denoising signal output terminal is connected with the pull-down node;

the intermediate denoising module comprises an eleventh transistor; a gate of the eleventh transistor is connected with the denoising signal output terminal, a first electrode of the eleventh transistor is connected with the first voltage terminal, and a second electrode of the eleventh transistor is connected with the second signal output terminal;

the output denoising module comprises a twelfth transistor; and a gate of the twelfth transistor is connected with the denoising signal output terminal, a first electrode of the twelfth transistor is connected with the first voltage terminal, and a second electrode of the twelfth transistor is connected with the third signal output terminal.

12. The gate driving circuit according to claim 7, wherein M≤4, and N/M≤6.

13. A display device, comprising a gate driving circuit which comprises two gate driving units, wherein
one gate driving unit of the two gate driving units comprises at least two stages of cascaded first shift registers, and the first shift register comprises a first unit, M second units and N third units, wherein M and N are positive integers, N is an integral multiple of M, 2≤M, and 2≤N/M;
the first unit is connected with a first signal input terminal, a first clock signal terminal, a second clock signal terminal, a first voltage terminal, a first reset signal terminal, a first signal output terminal and a fourth signal output terminal respectively and arranged to output a voltage of the first clock signal terminal to the first signal output terminal and the fourth signal output terminal under control of the first signal input terminal and the second clock signal terminal and output a voltage of the first voltage terminal to the first signal output terminal and the fourth signal output terminal under control of the first reset signal terminal and the second clock signal terminal;
a second unit is connected with a second signal input terminal, a second signal output terminal and a control clock signal terminal respectively and arranged to output a voltage of the control clock signal terminal to the second signal output terminal under control of the second signal input terminal;
a third unit is connected with an output clock signal terminal, a third signal input terminal and a third signal output terminal respectively and arranged to output a voltage of the output clock signal terminal to the third signal output terminal under control of the third signal input terminal;
the first signal output terminal of the first unit in the first shift register is connected with M second signal input terminals of the M second units; the second signal output terminal of each second unit is connected with third signal input terminals of N/M third units respectively, and different second signal output terminals are connected with different third signal input terminals; different second units are connected with different control clock signal terminals, and different third units are connected with different output clock signal terminals;
the other gate driving unit of the two gate driving units comprises at least two stages of cascaded second shift registers, and the second shift register comprises a fourth unit, M second units and N third units, wherein the fourth unit is connected with a first signal input terminal, a first clock signal terminal, a second clock signal terminal, a first voltage terminal, a first reset signal terminal and a first signal output terminal respectively and arranged to output a voltage of the first clock signal terminal to the first signal output terminal under control of the second clock signal terminal and output a voltage of the first voltage terminal to the first signal output terminal under control of the first reset signal terminal and the second clock signal terminal; the first signal output terminal of the fourth unit is connected with M second signal input terminals of the M second units;
third signal output terminals in the gate driving unit are arranged to be connected with gate lines which are sequentially arranged, the gate lines being divided into different gate line groups with each comprising N gate lines; one of the two gate driving units is connected with the gate lines in odd gate line groups which are sequentially arranged, while the other is connected with the gate lines in even gate line groups which are sequentially arranged; and
in each gate driving unit:
a first signal input terminal of a first-stage shift register is connected with an initial signal terminal,
a first signal input terminal of the shift register of any stage except the first-stage shift register is connected with a first signal output terminal of a previous-stage shift register of the shift register of present stage, and
a first reset signal terminal of the shift register of any stage except a last-stage shift register is connected with a first signal output terminal of a next-stage shift register of the shift register of the present stage;
the display device further comprises a backlight module and a driver Integrated Circuit (IC); the backlight module comprises a plurality of point light sources which are arranged in an array; the driver IC is arranged to provide a channel driving signal for the point light sources; and the fourth signal output terminal is arranged to provide a reset driving signal for the point light sources.

14. The display device according to claim 13, wherein the point light source is a Mini light emitting diode or a Micro light emitting diode.

15. A driving method for driving the first shift register according to claim 1, comprising:
outputting, by the first unit, the voltage of the first clock signal terminal to the first signal output terminal and the fourth signal output terminal under control of the first signal input terminal and the second clock signal terminal;
outputting, by the M second units, voltages of M control clock signal terminals to M second signal output terminals respectively under control of the first signal output terminal;
outputting, by the N third units, voltages of N output clock signal terminals to N third signal output terminals respectively under control of the M second signal output terminals; and
outputting, by the first unit, the voltage of the first voltage terminal to the first signal output terminal and the fourth signal output terminal under control of the first reset signal terminal and the second clock signal terminal,
wherein second clock signals and first clock signals are opposite clock signals; a voltage time period corresponding to the N/M output clock signal terminals of N/M third units connected with a same second unit is within a voltage time period corresponding to the control clock signal terminal of the second unit; and a voltage time period corresponding to the M control clock signal terminals of the M second units connected with the first unit is within a voltage time period corresponding to the first clock signal terminal of the first unit.

* * * * *